United States Patent
Kitazawa et al.

(10) Patent No.: US 12,164,207 B2
(45) Date of Patent: Dec. 10, 2024

(54) DISPLAY DEVICE

(71) Applicant: SHARP KABUSHIKI KAISHA, Osaka (JP)

(72) Inventors: Tazuko Kitazawa, Sakai (JP); Yoshihiro Ueta, Sakai (JP); Eiji Satoh, Sakai (JP); Zenken Kin, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/272,490

(22) PCT Filed: Jan. 22, 2021

(86) PCT No.: PCT/JP2021/002314
§ 371 (c)(1),
(2) Date: Jul. 14, 2023

(87) PCT Pub. No.: WO2022/157946
PCT Pub. Date: Jul. 28, 2022

(65) Prior Publication Data
US 2024/0069399 A1    Feb. 29, 2024

(51) Int. Cl.
*G02F 1/1368* (2006.01)
*G02F 1/1335* (2006.01)
*G02F 1/167* (2019.01)

(52) U.S. Cl.
CPC ...... *G02F 1/1368* (2013.01); *G02F 1/133528* (2013.01); *G02F 1/167* (2013.01)

(58) Field of Classification Search
CPC .............. H10K 59/50; H10K 59/1213; H01L 2251/5338; H01L 2251/566; G02F 1/13471; G02F 2201/44; G09G 2300/023
See application file for complete search history.

(56) References Cited

U.S. PATENT DOCUMENTS

| 2002/0113753 | A1* | 8/2002 | Sullivan .............. G02F 1/13718 349/5 |
| 2004/0140972 | A1* | 7/2004 | Hirota .................. G09G 3/3225 345/204 |
| 2008/0001538 | A1  | 1/2008 | Cok |
| 2012/0069064 | A1  | 3/2012 | Yamakita |

(Continued)

FOREIGN PATENT DOCUMENTS

| JP | 2005-010323 A | 1/2005 |
| JP | 2015-201314 A | 11/2015 |

(Continued)

*Primary Examiner* — Jonathan Y Jung
(74) *Attorney, Agent, or Firm* — ScienBiziP, P.C.

(57) ABSTRACT

A display device includes: a TFT substrate including a thin film transistor; a light-emitting element including a first electrode and a second electrode overlapping each other in a plan view, and a light-emitting layer placed between the first electrode and the second electrode; a third electrode capable of forming an electrical field between the second electrode and the third electrode; an optical adjustment element overlapping the light-emitting layer in a plan view and having an optical characteristic that changes in accordance with a potential difference between the second electrode and the third electrode; and light scattering bodies included in at least one of the TFT substrate, the light-emitting element, and the optical adjustment element.

20 Claims, 15 Drawing Sheets

(56) References Cited

U.S. PATENT DOCUMENTS

| | | | |
|---|---|---|---|
| 2015/0287768 A1 | 10/2015 | Sato | |
| 2016/0042696 A1 | 2/2016 | Hirakata et al. | |
| 2016/0238917 A1 | 8/2016 | Zhang | |
| 2017/0365234 A1* | 12/2017 | Yamazaki | G09G 3/34 |
| 2020/0081299 A1* | 3/2020 | Chen | G02F 1/133516 |
| 2020/0319521 A1* | 10/2020 | Qin | G02F 1/15 |
| 2021/0027677 A1* | 1/2021 | Jiang | H10K 59/8791 |

FOREIGN PATENT DOCUMENTS

| | | |
|---|---|---|
| JP | 2015-204255 A | 11/2015 |
| JP | 2016-038586 A | 3/2016 |
| JP | 2016-225092 A | 12/2016 |
| JP | 2019-135589 A | 8/2019 |
| WO | 2011058725 A1 | 5/2011 |

\* cited by examiner

DISPLAY DEVICE

TECHNICAL FIELD

The disclosure relates to a display device.

BACKGROUND ART

PTL 1 discloses a display device including a light scattering layer below a light-emitting element.

CITATION LIST

Patent Literature

PTL 1: JP 2015-204255 A

SUMMARY

Technical Problem

Such a display device has a problem that, when the light-emitting element is in a non-light emission state, screen quality is impaired due to scattering of external light in the light scattering layer.

Solution to Problem

According to one aspect of the disclosure, a display device including a TFT substrate including a thin film transistor, a light-emitting element including a first electrode, a second electrode, and a light-emitting layer placed between the first electrode and the second electrode, a third electrode capable of forming an electrical field between the second electrode and the third electrode, an optical adjustment element overlapping the light-emitting layer in a plan view and having an optical characteristic that changes in accordance with a potential difference between the second electrode and the third electrode, and light scattering bodies included in at least one of the TFT substrate, the light-emitting element, and the optical adjustment element.

Advantageous Effects of Disclosure

According to the one aspect of the disclosure, screen quality is improved by suppressing scattering of external light when the light-emitting element is in a non-light emission state while increasing usage efficiency of light from the light-emitting element by the light scattering bodies.

DESCRIPTION OF EMBODIMENTS

First Embodiment

Figure 1:
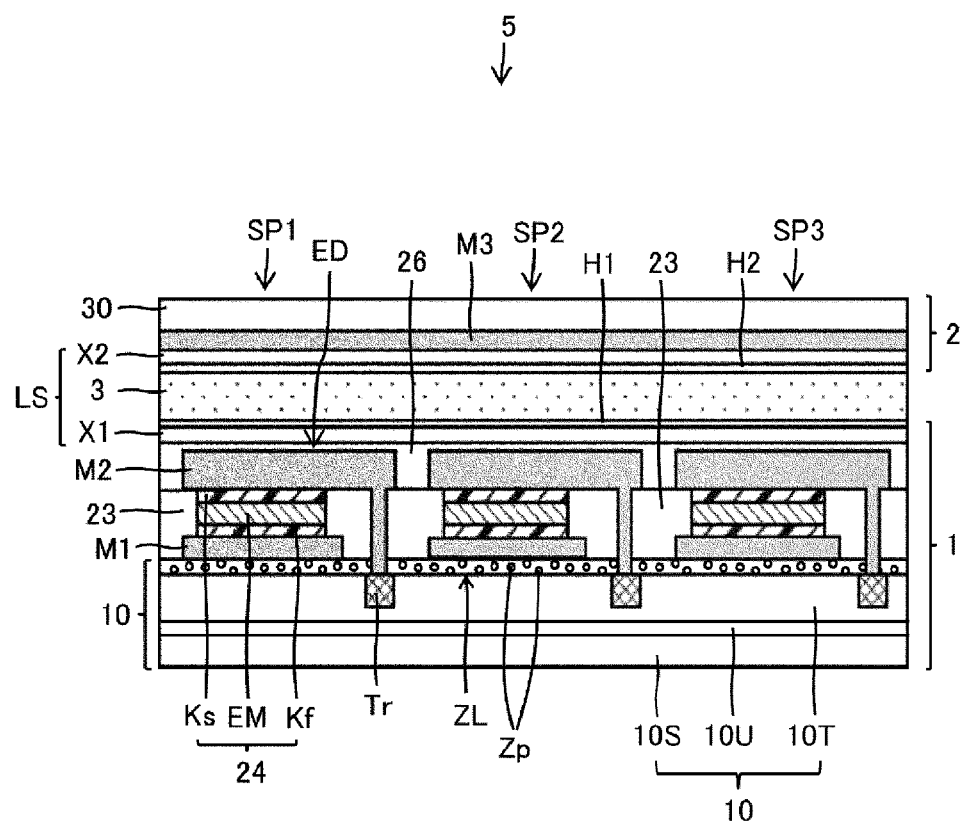
FIG. 1 is a cross-sectional view illustrating a configuration of a display device according to a first embodiment.

FIG. 1 is a cross-sectional view illustrating a configuration of a display device according to a first embodiment. As illustrated in FIG. 1, a display device 5 includes a first member 1 including a TFT substrate 10, a second member 2 facing the first member 1, and a liquid crystal layer 3 placed between the first member 1 and the second member 2. In the first member 1, first electrodes M1, an edge cover film 23, electroluminescent (EL) layers 24, second electrodes M2, a sealing layer 26, a first polarizer X1, and a first alignment film H1 are provided in this order on the TFT substrate 10 including multiple thin film transistors Tr. In the second member 2, a third electrode M3, a second polarizer X2, and a second alignment film H2 are provided in this order on a counter substrate 30.

Hereinafter, a direction from the TFT substrate 10 to the counter substrate 30 is described as "upward direction", and a direction from the counter substrate 30 to the TFT substrate 10 is described as "downward direction" in FIG. 1. In other words, "lower layer" means a layer that is formed in a process prior to that of a comparison layer, and "upper layer" means a layer that is formed in a process after that of a comparison layer.

The display device 5 is of a top emission type and is viewed from a counter substrate 30 side. The second electrode M2, the sealing layer 26, the third electrode M3, and the counter substrate 30 have a light transmitting property. A light scattering layer ZL containing light scattering bodies Zp is included in the TFT substrate 10. The first electrode M1 may be a transparent electrode or a light-reflecting electrode.

The TFT substrate 10 is obtained, for example, by forming an undercoat layer 10U, a thin film transistor layer (TFT layer) 10T, and the light scattering layer ZL on a base material 10S made of glass, resin, or the like. The light scattering layer ZL is formed by dispersing the light scattering bodies Zp such as silica particles, alumina particles, titanium oxide particles, zirconia oxide particles, acrylic particles, or melanin particles in resin. Instead of forming the light scattering layer ZL, the base material 10S or the TFT layer 10T may contain the light scattering bodies Zp.

The edge cover film 23 is an insulating film that covers edges of the first electrodes M1. The sealing layer 26 is a layer that prevents penetration of foreign matters such as water and oxygen. The first polarizer (first polarization layer) X1 may be a polarizing film coated on the sealing layer 26, or may be a polarizer bonded on the sealing layer 26. The same applies to the second polarizer (second polarization layer) X2.

The first member 1 and the second member 2 are disposed to face each other such that the first alignment film H1 and the second alignment film H2 are in contact with the liquid crystal layer 3, and the first polarizer X1, the first alignment film H1, the liquid crystal layer 3, the second alignment film H2, and the second polarizer X2 form an optical adjustment element LS (liquid crystal cell).

The EL layer 24 of the first member 1 includes a first charge transport layer Kf, a light-emitting layer EM, and a second charge transport layer Ks. The first electrode M1, the edge cover film 23, the EL layer 24, and the second electrode M2 constitute a light-emitting element ED. The first charge transport layer Kf and the second charge transport layer Ks have a light transmitting property. The light-emitting element ED is, for example, a quantum dot light emitting diode (QLED) provided on a subpixel-by-subpixel basis, but it is not limited to this, and may be an organic light-emitting diode (OLED). The third electrode M3 is a counter electrode facing the multiple light-emitting elements ED.

The display device 5 includes a first subpixel SP1 that emits red light, a second subpixel SP2 that emits green light, and a third subpixel SP3 that emits blue light. Each of the first subpixel SP1, the second subpixel SP2, and the third subpixel SP3 includes the first electrode M1, the second electrode M2, the light-emitting layer EM, and the optical adjustment element LS. The third electrode M3 is common to the first subpixel SP1, the second subpixel SP2, and the third subpixel SP3. The light-emitting layer EM of the first subpixel SP1 emits red light, the light-emitting layer EM of the second subpixel SP2 emits green light, and the light-emitting layer EM of the third subpixel SP3 emits blue light.

The first electrode M1 and the second electrode M2 are connected to a pixel circuit (described later) of the TFT substrate 10 and overlap each other in a plan view. The second electrode M2 is connected to the transistor Tr of the TFT substrate 10. The light-emitting layer EM is placed between the first electrode M1 and the second electrode M2, and overlaps the first electrode M1 and the second electrode M2 in a plan view. The third electrode M3 faces the second electrode M2 via the liquid crystal layer 3, and can form an electrical field between the second electrode M2 and the third electrode M3. The optical adjustment element LS placed between the second electrode M2 and the third electrode M3 overlaps the light-emitting layer EM in a plan view. Light transmittance of the optical adjustment element LS changes according to a potential difference between the second electrode M2 and the third electrode M3 (=a potential of the second electrode—a potential of the third electrode). The optical adjustment element LS is in one of multiple optical states (e.g., a light blocking state, a light transmitting state, and a transient state) in accordance with this potential difference. Note that "multiple members overlap in a plan view" refers to a state in which at least part of one member and at least part of another member overlap when the multiple members are viewed in, for example, the normal direction of a display surface.

FIG. 2(a) is an explanatory diagram illustrating potentials of the first to third electrodes, FIG. 2(b) is a graph showing a characteristic of current of the light-emitting layer and light emission intensity, FIG. 2(c) is a graph showing a characteristic of the current of the light-emitting layer and voltage, FIG. 2(d) is a graph showing a characteristic of the voltage of the light-emitting layer and the light emission intensity, and FIG. 2(e) is a graph showing a characteristic of voltage of the optical adjustment element and transmittance.

Figure 2:
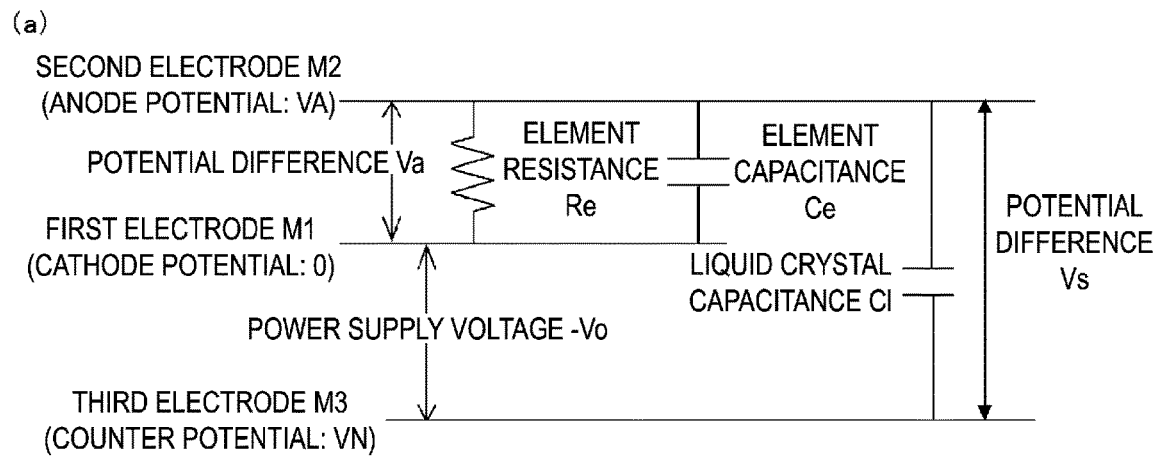
FIG. 2(a) is an explanatory diagram illustrating potentials of first to third electrodes.
FIG. 2(b) is a graph showing a characteristic of current of a light-emitting layer and light emission intensity.
FIG. 2(c) is a graph showing a characteristic of the current of the light-emitting layer and voltage.
FIG. 2(d) is a graph showing a characteristic of the voltage of the light-emitting layer and the light emission intensity.
FIG. 2(e) is a graph showing a characteristic of voltage of an optical adjustment element and transmittance.
Figure 2:
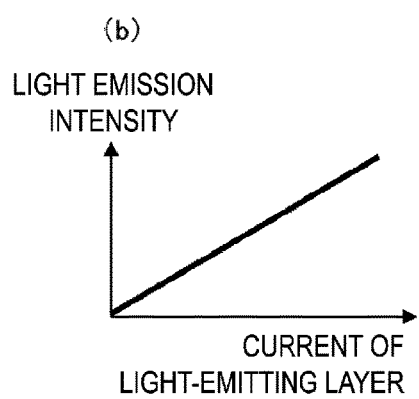
Figure 2:
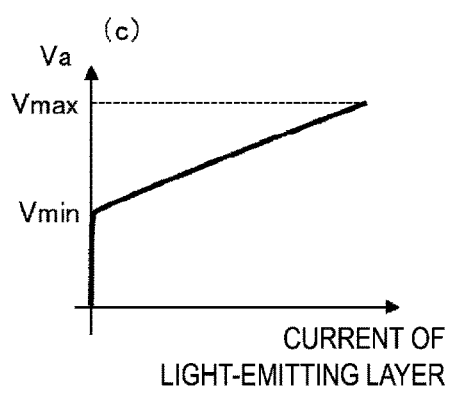
Figure 2:
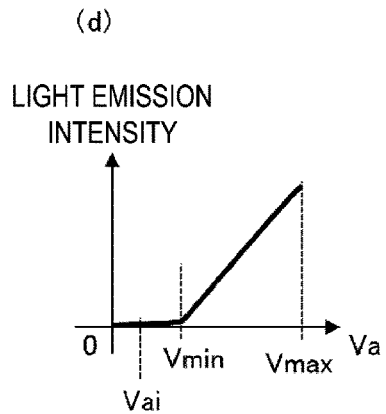
Figure 2:
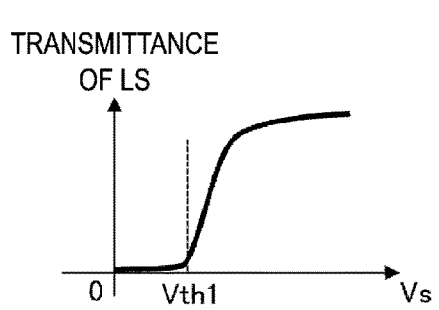

In the first embodiment, as illustrated in FIG. 2, the potential of the first electrode M1 connected to the ground is 0, a potential VA of the second electrode M2 is an anode potential, and a potential VN of the third electrode M3 (counter electrode) is a counter potential. Although a power supply voltage −Vo is applied so that the third electrode M3 is negative with respect to the first electrode M1 in FIG. 2, the power supply voltage is not limited to being negative, and a positive power supply voltage may be applied to the third electrode M3 and the potential VA of the second electrode M2 may be a negative potential.

An element resistance Re and an element capacitance Ce are formed between the first electrode M1 and the second electrode M2. A liquid crystal capacitance Cl is formed between the second electrode M2 and the third electrode M3.

In the light-emitting element ED, when current generated in the light-emitting layer EM (current at the element resistance Re) increases, the light emission intensity of the light-emitting layer EM increases, and the potential difference Va between the second electrode M2 and the first electrode M1 also increases. Due to the element capacitance Ce, no current is generated in the light-emitting layer EM when the potential difference Va is less than Vmin (positive voltage) in FIG. 2, and current is generated in the light-emitting layer EM (the light-emitting layer EM emits light) when the potential difference Va is Vmin or higher in FIG. 2. When the potential difference Va is Vmax, the light emission intensity of the light-emitting layer EM is maximum (luminance corresponding to the maximum gray scale of the subpixel). A potential difference Vs (=VA−VN) between the second electrode M2 and the third electrode M3 is a voltage applied to the liquid crystal capacitance Cl (including the optical adjustment element LS). Since the potential of the first electrode M1 is 0, the potential VN is a value of the power supply voltage −Vo itself, and the potential VA is a value of the potential difference Va itself. When no current is injected (no voltage is applied) to the second electrode M2, the potential difference Va is a divided voltage value Vai determined by Equation 1 below based on a capacitance ratio between the element capacitance Ce and the liquid crystal capacitance Cl.

$$Vai=-Vo \times Ce/(Ce+Cl) \qquad \text{[Equation 1]}$$

FIG. 3(a) is a schematic view illustrating a layered structure of the light-emitting layer and the first to third electrodes of the first embodiment, FIG. 3(b) is a schematic view illustrating states of the optical adjustment element and the light-emitting layer, FIG. 3(c) is an explanatory diagram illustrating operation of the display device, and FIG. 3(d) is a graph showing a characteristic of the voltage of the optical adjustment element and the transmittance.

Figure 3:
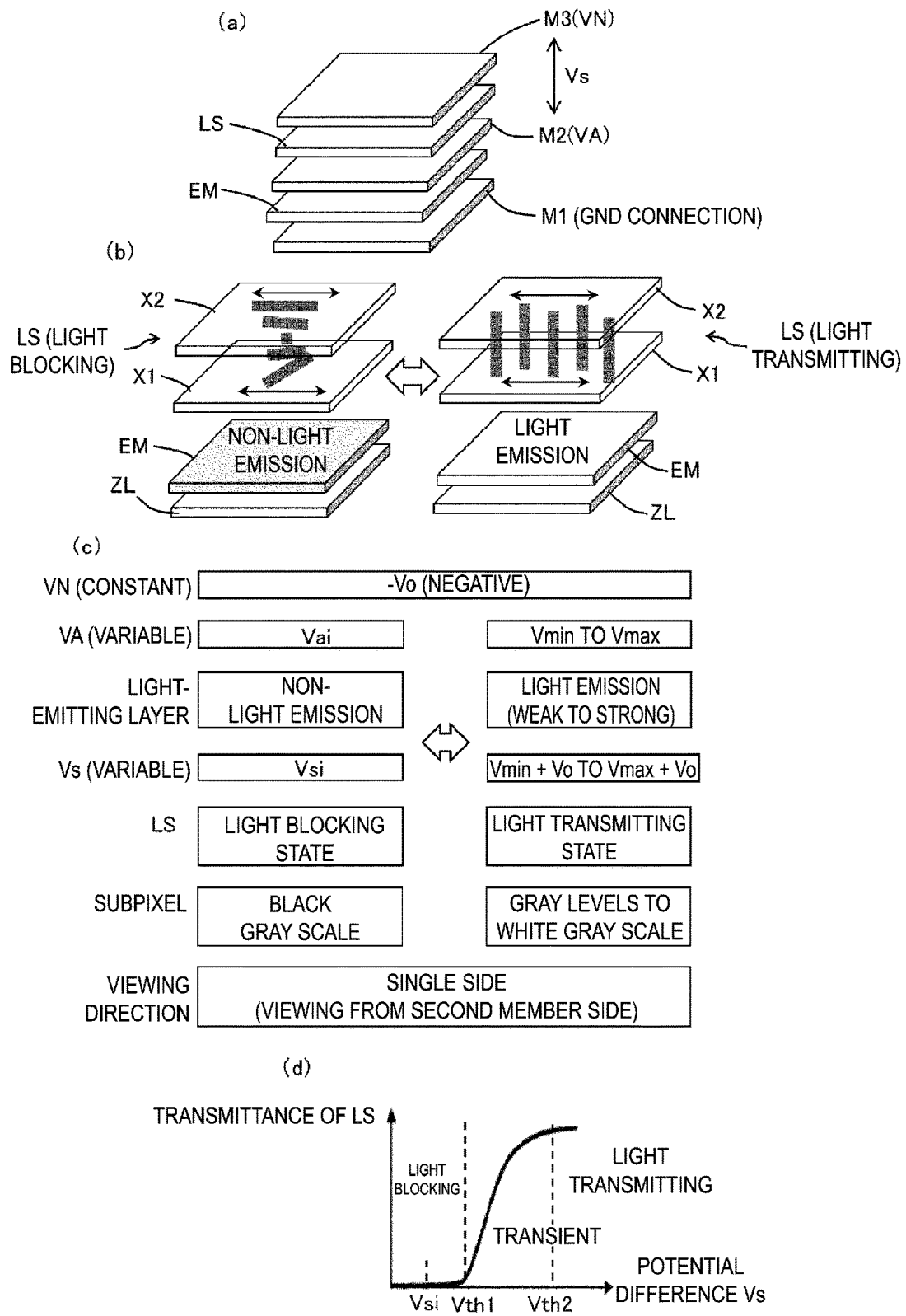
FIG. 3(a) is a schematic view illustrating a layered structure of the light-emitting layer and the first to third electrodes of the first embodiment.
FIG. 3(b) is a schematic view illustrating states of the optical adjustment element and the light-emitting layer.
FIG. 3(c) is an explanatory diagram illustrating operation of the display device.
FIG. 3(d) is a graph showing a characteristic of the voltage of the optical adjustment element and the transmittance.

As illustrated in FIG. 3, a polarization axis of the first polarization layer X1 and a polarization axis of the second polarization layer X2 are parallel, so the optical adjustment element LS is in the light blocking state when the potential VA of the second electrode M2 is low (the potential difference Vs is small), and the optical adjustment element LS is in the light transmitting state when the potential VA of the second electrode M2 is high (the potential difference Vs is large).

Optical states of the optical adjustment element LS in which the polarization axes of the first polarization layer X1 and the second polarization layer X2 are parallel include the light blocking state in which liquid crystal molecules are substantially lying down, the light transmitting state in which the liquid crystal molecules are substantially standing, and the transient state from the light blocking state to the light transmitting state. The optical adjustment element LS is in the light blocking state when the liquid crystal layer 3 rotates the polarization direction of light (preferably by 90 degrees), and is in the light transmitting state when the polarization direction is not changed. For the potential difference Vs, a threshold value when a state changes from the light blocking state (a state in which the liquid crystal molecules are substantially lying down) to the transient state (a state in which some of the liquid crystal molecules are standing) is a first voltage Vth1, and a threshold value when a state changes from the transient state to the light transmitting state (a state in which the liquid crystal molecules are substantially standing) is a second voltage Vth2. Here, Vth1<Vth2. FIG. 3 illustrates a case in which the liquid crystal layer of the optical adjustment element LS is of a TN system, but the same applies to a vertical alignment (VA) system.

As shown in FIG. 3(d), by setting a value Vsi (=Vo×Cl/(Ce+CO)) of the potential difference Vs when no current is injected into the second electrode M2 to be less than the first voltage Vth1, and by making the potential difference Vs (=Vmin+Vo) greater than the first voltage Vth1 when current is injected into the second electrode M2 and the potential VA is Vmin, when no current is injected into the second electrode M2, the optical adjustment element LS is in the light blocking state, and when the current is injected into the second electrode M2 and the potential VA is Vmin or higher, the optical adjustment element LS is in the transient state or the light transmitting state. As an example, Vo=0.1 [V], Vth1=1.0 [V], Vmin=2.0 [V], and Vmax=5.0 [V] are assumed. Usually, the light-emitting layer EM has a relative dielectric constant εe of about 8.0 and a film thickness De of about 50 nm, and the optical adjustment element LS has a relative dielectric constant cl of about 6.0 and a film thickness Dl of about 50 μm. The element capacitance Ce and the liquid crystal capacitance Cl is calculated using Equation 2 and Equation 3 below.

$$Ce=\varepsilon 0 \times \varepsilon e \times S/De \qquad \text{[Equation 2]}$$

$$Cl=\varepsilon 0 \times \varepsilon l \times S/Dl \qquad \text{[Equation 3]}$$

where ε0 is a dielectric constant of vacuum and S is an electrode area. From Equations 1, 2, and 3, when no current is injected into the second electrode M2, Vai is −0.099 V and Vsi is 0.001 V, which is smaller than Vth1. When the current is injected into the second electrode M2 and Va is Vmin, Vs is 2.1 V, which is larger than Vth1.

In this way, during a non-light emission period in which the light-emitting layer EM is in a non-light emission state, the optical adjustment element LS is in the light blocking state and the subpixel is displayed in black gray scale, and during a light emission period in which the light-emitting layer EM is in a light emission state, the optical adjustment element LS is in the light transmitting state and the subpixel is displayed in gray levels to white gray scale.

According to the first embodiment, when the light-emitting layer EM is in the light emission state (light emission period), the optical adjustment element LS is autonomously in the light transmitting state or the transient state. At this time, light from the light-emitting layer EM is backscattered by the light scattering layer ZL, and light usage efficiency (light extraction efficiency) is enhanced. When the light-emitting layer EM is in the non-light emission state (non-light emission period), the optical adjustment element LS is autonomously in the light blocking state to block external light incident from a viewing surface. Accordingly, scattering of external light (e.g., glare) in the light scattering layer ZL is suppressed, and screen quality can be enhanced.

Figure 4:
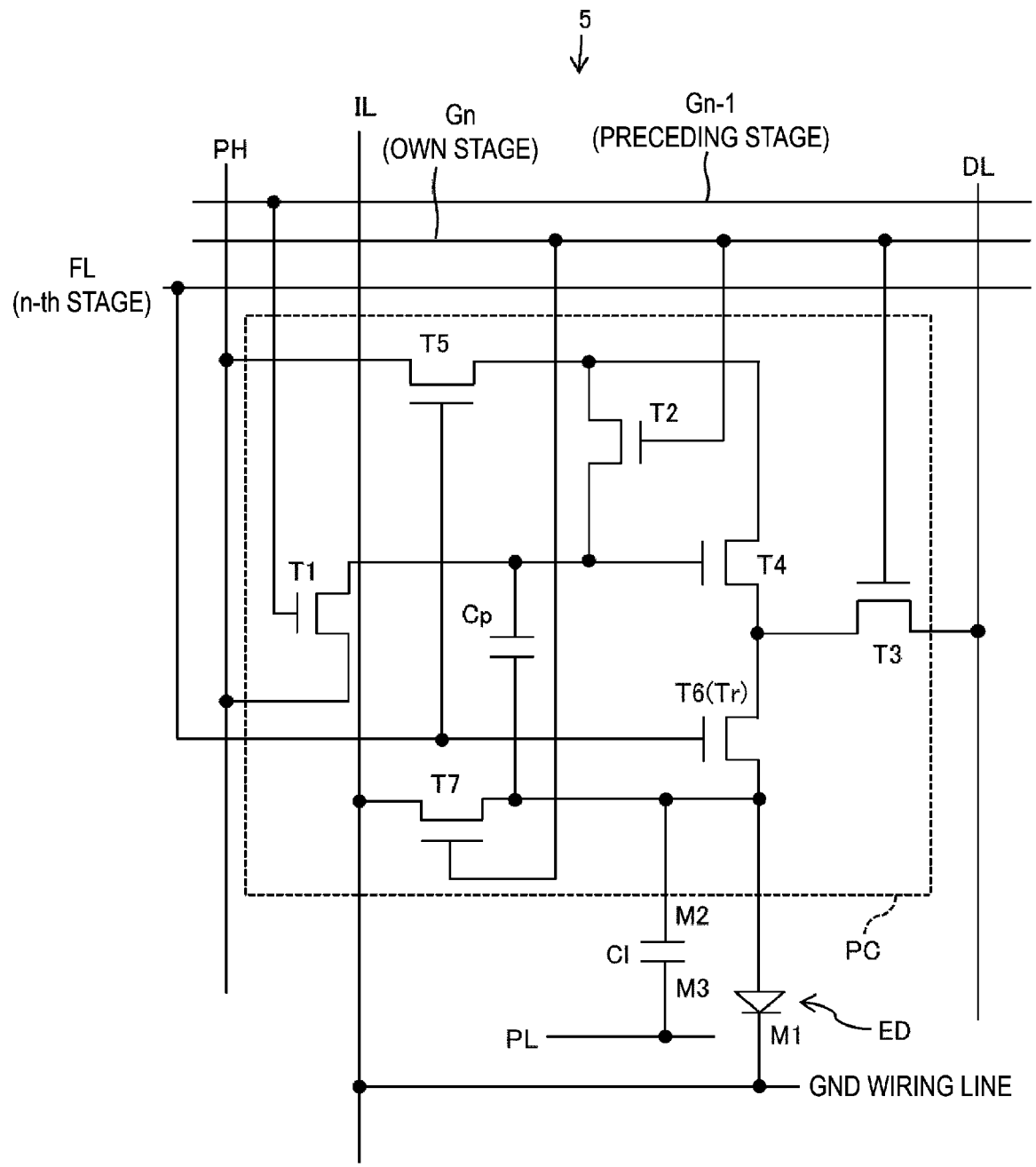
FIG. 4 is a circuit diagram illustrating an example of a connection relationship between a pixel circuit of a TFT substrate and the first to third electrodes.

FIG. 4 is a circuit diagram illustrating an example of a connection relationship between the pixel circuit of the TFT substrate and the first to third electrodes. A pixel circuit PC in FIG. 4 includes a capacitance element Cp, a reset transistor T1 including a gate terminal connected to a scanning signal line Gn-1 for a preceding stage, a threshold control transistor T2 including a gate terminal connected to a scanning signal line Gn for a stage of this pixel circuit PC itself, a writing control transistor T3 including a gate terminal connected to the scanning signal line Gn for the stage of this pixel circuit PC itself, a drive transistor T4 that controls current of the light-emitting element ED, a power supply transistor T5 including a gate terminal connected to a light emission control line FL, a light emission control transistor T6 including a gate terminal connected to the light emission control line FL, and an initialization transistor T7 including a gate terminal connected to the scanning signal line Gn for the stage of the pixel circuit PC itself.

The gate terminal of the drive transistor T4 is connected to an anode (the second electrode M2) of the light-emitting element ED via the capacitance element Cp, and is connected to a power source line PH via the reset transistor T1. A high potential side power supply is supplied to the power source line PH.

A source terminal of the drive transistor T4 is connected to a data signal line DL via the writing control transistor T3, and is connected to the anode of the light-emitting element ED via the light emission control transistor T6 (transistor Tr in FIG. 1). A drain terminal of the drive transistor T4 is connected to the gate terminal of the drive transistor T4 via the threshold control transistor T2, and is connected to the power source line PH via the power supply transistor T5.

The anode of the light-emitting element ED is connected to an initialization signal line IL via the initialization transistor T7. The initialization signal line IL and a cathode of the light-emitting element ED (the first electrode MD is connected to a ground wiring line (GND wiring line). The third electrode M3 of the second member 2 is connected to a power source line PL that supplies the negative power supply voltage Vo.

Figure 5:
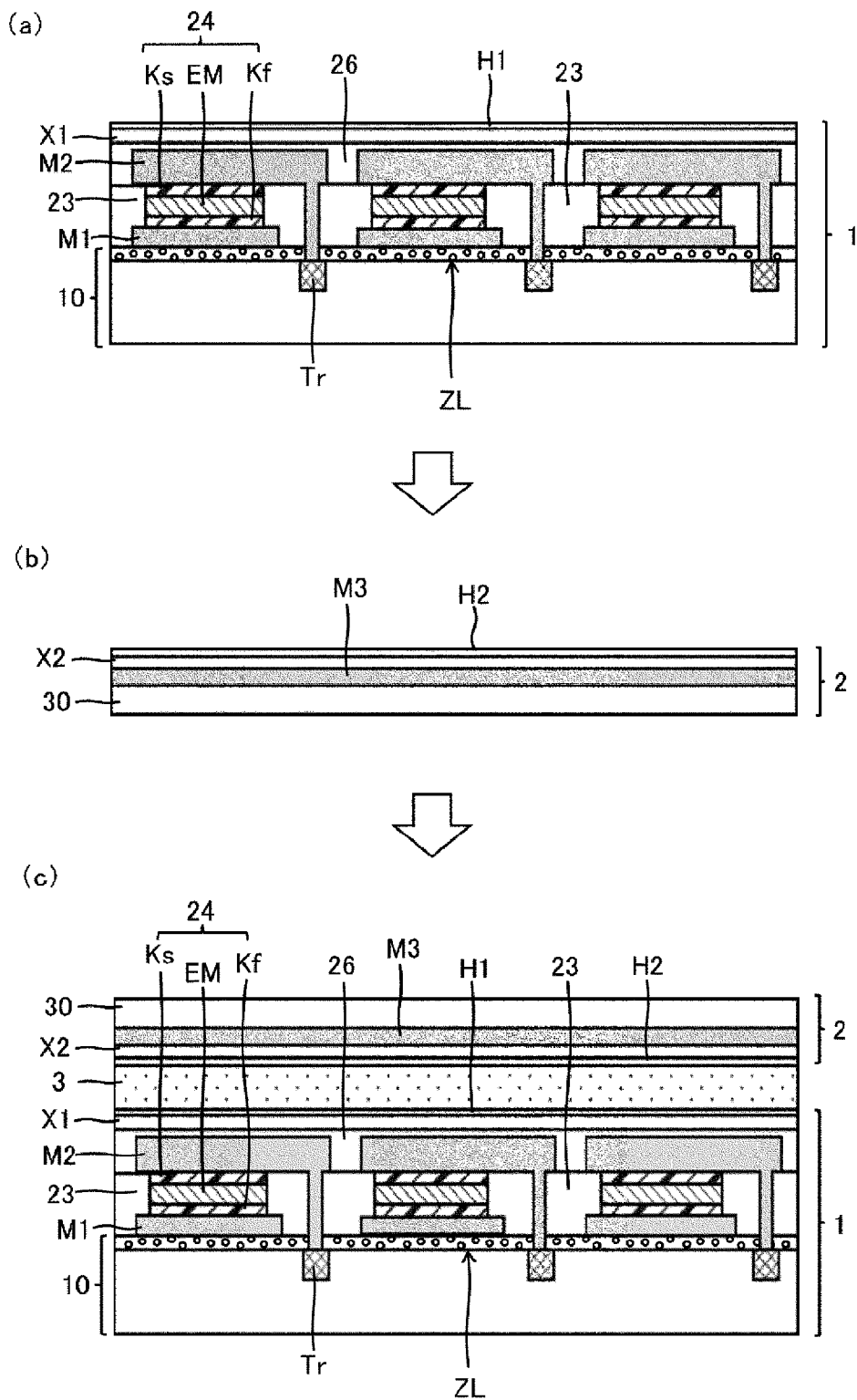
FIGS. 5(a) to 5(c) are cross-sectional views illustrating a manufacturing method of the display device according to the first embodiment.

FIGS. 5(a) to 5(c) are cross-sectional views illustrating a manufacturing method of the display device according to the first embodiment. In FIG. 5(a), the first electrodes M1, the edge cover film 23, the electroluminescent (EL) layers 24, the second electrodes M2, the sealing layer 26, the first polarizer X1, and the first alignment film H1 are formed in this order on the TFT substrate 10 including the light scattering layer ZL to form the first member 1. In FIG. 5(b), the third electrode M3, the second polarizer X2, and the second alignment film H2 are formed in this order on the counter substrate 30 to form the second member 2. In FIG. 5(c), the first member 1 and the second member 2 are bonded so that the first alignment film H1 and the second alignment film H2 face each other with a space therebetween, and a liquid crystal material is sealed in this space to form the liquid crystal layer 3.

Here, the first polarization layer X1 and the second polarization layer X2 may be formed by applying a material that forms a polarization pattern. In this configuration, external light that has passed through the second polarization layer X2 reaches the first polarization layer X1 without being disturbed in the polarization direction due to scattering or the like, and is blocked. This enables highly pure black display and is also suitable for flexibility.

Figure 6:
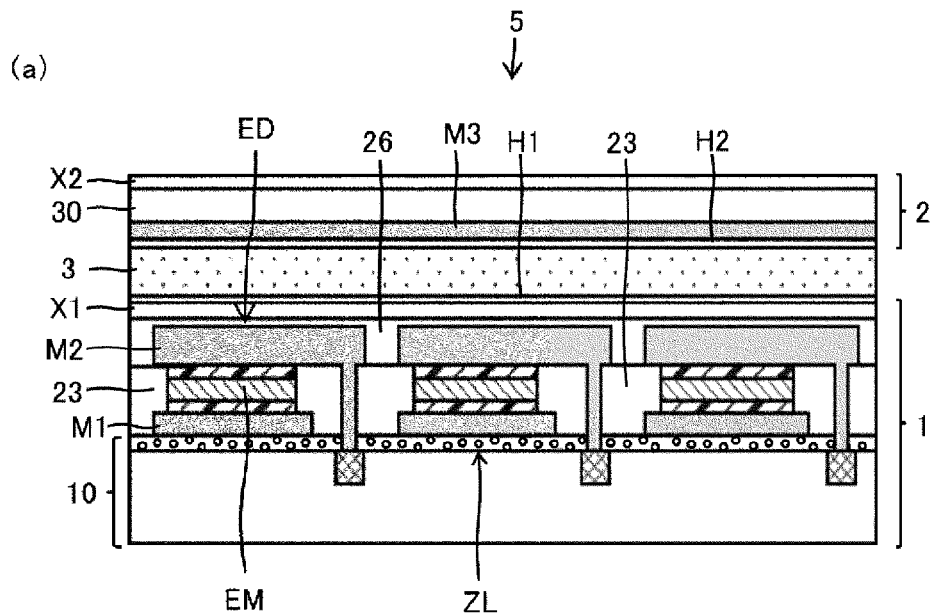
FIGS. 6(a) and 6(b) are cross-sectional views illustrating modified examples of the display device according to the first embodiment.
Figure 6:
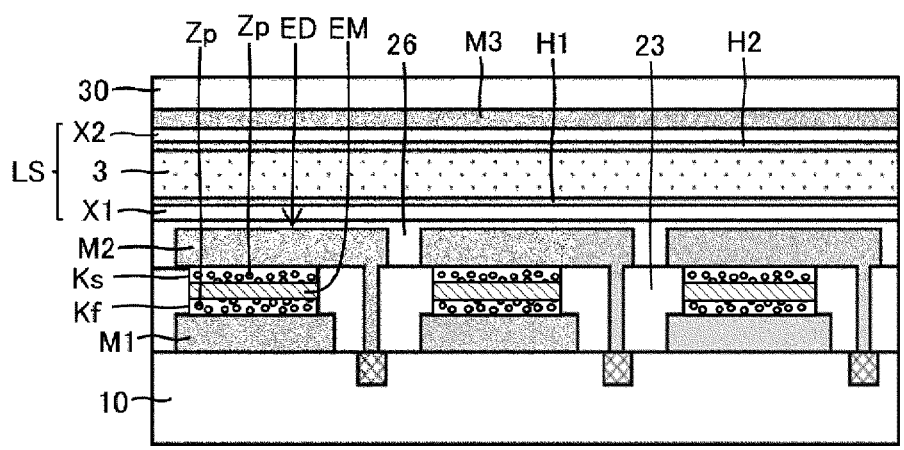

FIG. 6 are cross-sectional views illustrating modified examples of the display device according to the first embodiment. In FIG. 1, the second polarizer X2 is placed between the counter substrate 30 and the liquid crystal layer 3 (inside of the counter substrate 30), but a position of the second polarizer X2 is not limited thereto. As illustrated in FIG. 6(a), the second polarizer X2 may be placed outside the counter substrate 30 (above the third electrode M3). In this configuration, a polarizer that can be bonded to the counter substrate 30 can be used as the second polarization layer X2, which facilitates manufacturing.

In FIG. 1, the light scattering bodies Zp are provided in the TFT substrate 10, but a position in which the light scattering bodies Zp are provided is not limited to the TFT substrate 10. As illustrated in FIG. 6(b), at least one of the first charge transport layer Kf (electron transport layer) and the second charge transport layer Ks (hole transport layer) of the light-emitting element ED may contain the light scattering bodies Zp (e.g., nanoparticles).

Although the optical adjustment element LS is provided in common across multiple subpixels in the first embodiment, the optical adjustment element LS may be provided individually for each cell. In this configuration, up to the second electrodes M2 are formed in FIG. 5(a), up to the second electrodes M2, which operate the optical adjustment elements LS (liquid crystal cells), are formed in FIG. 5(b), and then the second electrodes M2 are bonded to each other.

FIG. 7(a) is a cross-sectional view illustrating a further modified example of the display device according to the first embodiment, FIG. 7(b) is an explanatory diagram illustrating the potentials of the first to third electrodes, and FIG. 7(c) is an explanatory diagram illustrating operation of the display device. In FIG. 1, the second electrode M2 and the third electrode M3 are arranged in the layering direction (normal direction to the substrate), and a vertical electrical field is generated between the second electrode M2 and the third electrode M3, but the electrical field generated between the second electrode M2 and the third electrode M3 is not limited to the vertical electrical field. As illustrated in FIG. 7(a), by using liquid crystals that adopt a transverse electrical field control mode for the liquid crystal layer 3 and arranging the second electrode M2 and the third electrode M3 adjacent to each other in a planar direction (direction parallel to the substrate), a transverse electrical field may be generated between the second electrode M2 and the third electrode M3. The third electrode M3 is connected to the power source line PL that supplies the negative power supply voltage Vo. In this configuration, the second electrodes M2 and the third electrodes M3 are formed in the same layer, thereby reducing the number of manufacturing steps and reducing manufacturing costs. Alternatively, the third electrode M3 may be formed in a comb-teeth shape so as to straddle the subpixels, and a common power supply voltage (−Vo) may be applied to the third electrode M3.

FIGS. 7(b) and 7(c) are similar to FIGS. 2(a) and 3(c). When the light-emitting layer EM is in the non-light emission state, the optical adjustment element LS is in the light blocking state and the subpixel is displayed in black gray scale.

Figure 7:
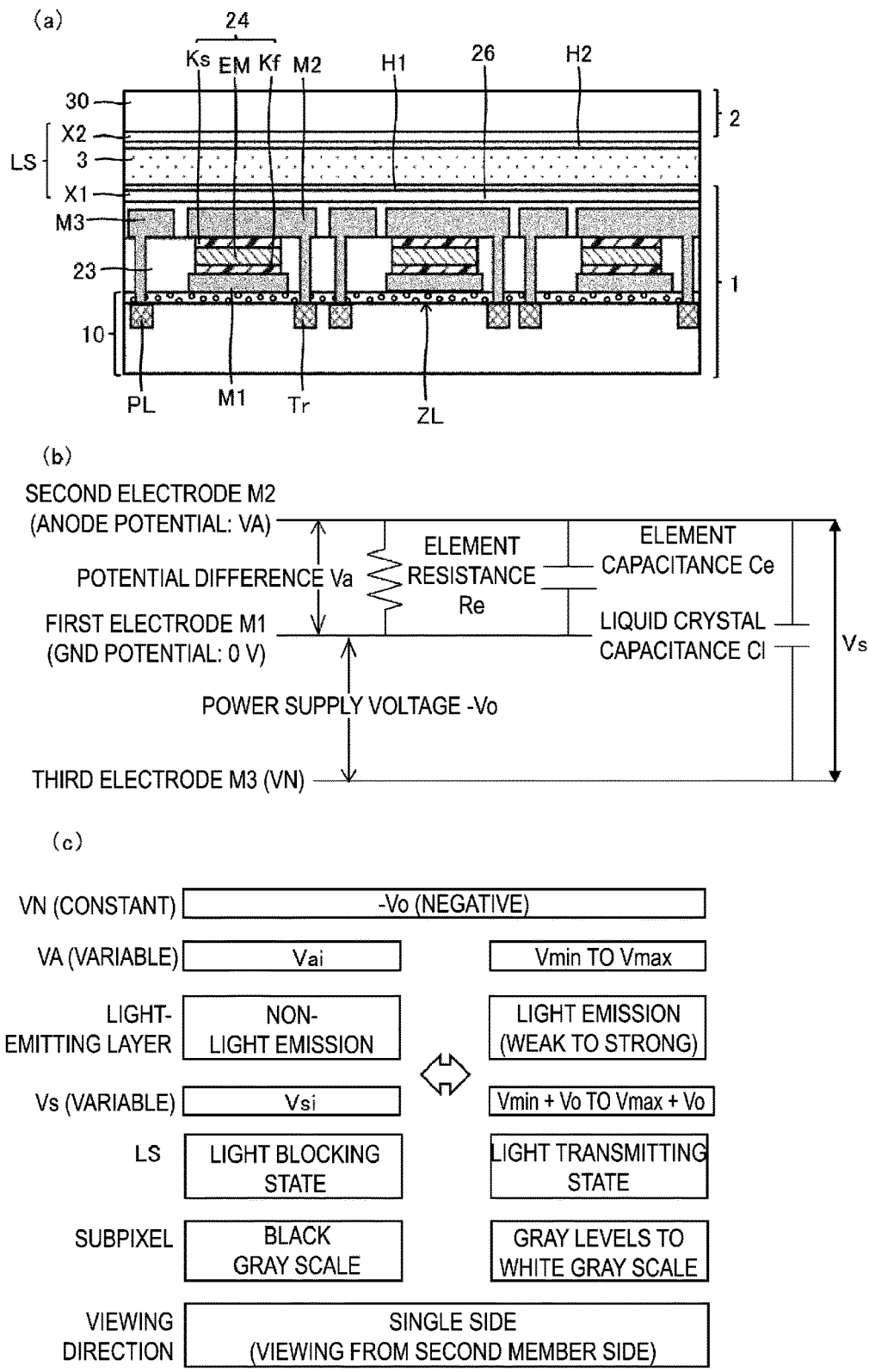
FIG. 7(a) is a cross-sectional view illustrating a further modified example of the display device according to the first embodiment.
FIG. 7(b) is an explanatory diagram illustrating the potentials of the first to third electrodes.
FIG. 7(c) is an explanatory diagram illustrating operation of the display device.

On the other hand, when the light-emitting layer EM is in the light emission state, the optical adjustment element LS is in the light transmitting state, and the subpixel is displayed in gray levels to white gray scale. In FIG. 7, the polarization axis of the first polarization layer X1 and the polarization axis of the second polarization layer X2 are parallel, so in the light blocking state, the polarization direction of light incident on the liquid crystal layer 3 is rotated (preferably by 90 degrees) and in the light transmitting state, the polarization direction of light incident on the liquid crystal layer 3 is maintained.

According to the configuration illustrated in FIG. 7, when the light-emitting layer EM is in the light emission state, the optical adjustment element LS is autonomously in the light transmitting state or the transient state. At this time, light from the light-emitting layer EM is backscattered by the light scattering layer ZL, and light usage efficiency (light extraction efficiency) is enhanced. When the light-emitting layer EM is in the non-light emission state, the optical adjustment element LS is autonomously in the light blocking state to block external light incident from the viewing surface. Accordingly, scattering of external light (e.g., glare) in the light scattering layer ZL is suppressed, and screen quality can be enhanced.

Second Embodiment

Figure 8:
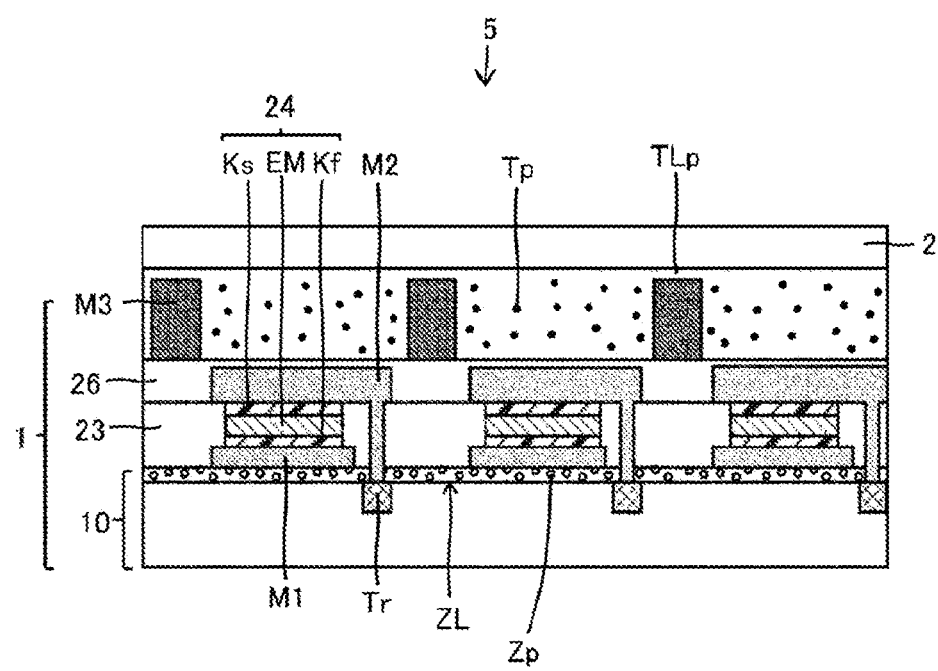
FIG. 8 is a cross-sectional view illustrating a configuration of a display device according to a second embodiment.

FIG. 8 is a cross-sectional view illustrating a configuration of a display device according to a second embodiment. As illustrated in FIG. 8, a display device 5 includes a first member 1, a second member 2 facing the first member 1, and an electrophoretic optical adjustment element TLp placed between the first member 1 and the second member 2. In the first member 1, first electrodes M1, an edge cover film 23, electroluminescent (EL) layers 24, second electrodes M2, a sealing layer 26, and third electrodes M3 are provided in this order on a TFT substrate 10 including multiple thin film transistors Tr.

The display device 5 is of a top emission type, and is viewed from a second member 2 side. The first electrode M1 has light reflectivity, and the second electrode M2, the sealing layer 26, and the second member 2 have a light transmitting property. The third electrode M3 has a light blocking property and does not overlap a light-emitting region of the light-emitting layer EM. In a plan view (when viewed from a viewing surface), an area of the third electrode M3 is smaller than an area of the second electrode M2.

Figure 9:
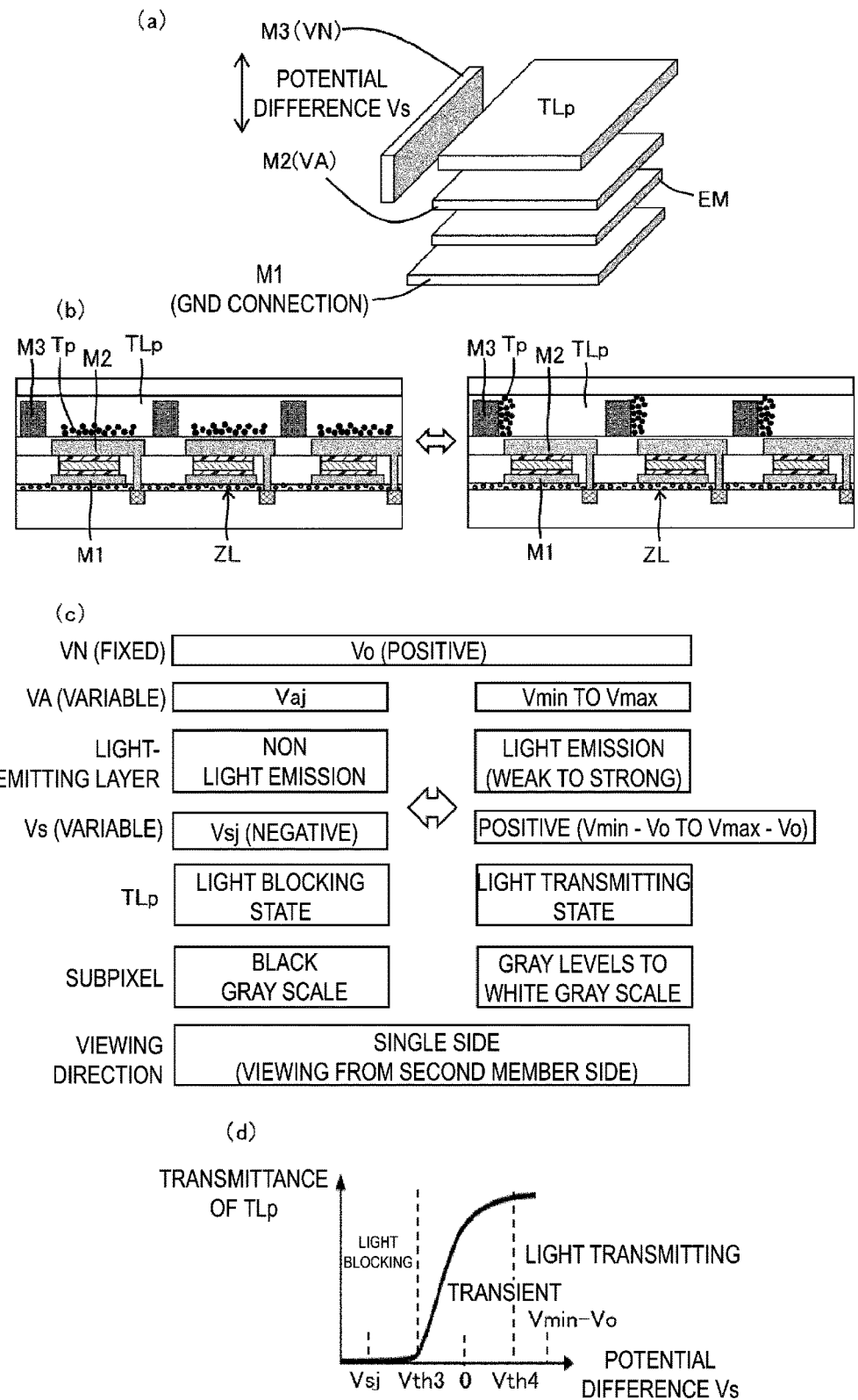
FIG. 9(a) is an explanatory diagram illustrating potentials of first to third electrodes of the second embodiment.
FIG. 9(b) is a schematic view illustrating operation of the display device.
FIG. 9(c) is an explanatory diagram illustrating the operation of the display device.
FIG. 9(d) is a graph showing a characteristic of voltage of an optical adjustment element and transmittance.

FIG. 9(a) is an explanatory diagram illustrating potentials of the first to third electrodes according to the second embodiment, FIG. 9(b) is a cross-sectional view illustrating operation of the display device, FIG. 9(c) is an explanatory diagram illustrating the operation of the display device, and FIG. 9(d) is a graph showing a characteristic of voltage of the optical adjustment element and transmittance. In FIG. 9, a potential difference Vs is obtained by subtracting a potential VN of the third electrode M3 from a potential VA of the second electrode M2. The potential VA of the second electrode M2 is variable and the potential VN of the third electrode M3 is fixed. Since a power supply voltage Vo is applied between the first electrode M1 and the third electrode M3, and the first electrode M1 is grounded, the potential VN of the third electrode M3 is a value of Vo itself. The potential VA of the second electrode M2 is a value of the potential difference Va itself between the first electrode M1 and the second electrode M2. When no current is injected (no voltage is applied) to the second electrode M2, the potential difference Va is a divided voltage value Vaj determined by Equation 4 below based on a capacitance ratio between an element capacitance Ce and an electrophoretic layer capacitance Cj.

$$Vaj = Vo \times Ce/(Ce+Cj) \quad \text{[Equation 4]}$$

Thus, when no current is injected into the second electrode M2, a value Vsj of the potential difference Vs is $-Vo \times Cj/(Ce+Cj)$, and when VA is Vmin or higher, the potential difference Vs is Vmin−Vo or higher.

The optical adjustment element TLp is an electrophoretic layer containing toner Tp having a positive charge. The optical adjustment element TLp is in a light blocking state when the potential difference Vs is negative, and is in a light transmitting state when the potential difference Vs is positive. The toner Tp is black, that is, the toner absorbs visible light, and for example, pigment fine particles or the like. A particle size may be about several μm. The toner Tp is contained in an isoparaffin-based transparent insulating liquid or the like so as to be movable when an electrical field is applied.

States of the optical adjustment element TLp include a light transmitting state in which the toner Tp gathers near a side surface of the third electrode M3 and does not overlap the light-emitting layer in a plan view, a light blocking state in which the toner Tp gathers near an upper surface of the second electrode M2 and overlaps the light-emitting layer in a plan view, and a transient state from the light blocking state to the light transmitting state. When the toner Tp gathers near the side surface of the third electrode M3, the toner Tp may or may not be in contact with the side surface. When the toner is not in contact with the side surface of the third electrode M3, a distance between the side surface and a particle of the toner Tp closest to the side surface is substantially the same as a distance between particles of the toner Tp. When the toner Tp gathers near the upper surface of the second electrode M2, the toner Tp may or may not be in contact with the upper surface. When the toner is not in contact with the upper surface of the second electrode M2, a distance between the upper surface and a particle of the toner Tp closest to the upper surface is substantially the same as a distance between particles of the toner Tp.

For the potential difference Vs, a threshold value from the light blocking state (the state in which the toner Tp gathers near the upper surface of the second electrode M2 and overlaps the light-emitting layer in a plan view) to the transient state (the state in which some of the toner Tp is away from the upper surface of the second electrode M2) is a third voltage Vth3 (≤0), and a threshold value from the transient state to the light transmitting state (the state in which the toner Tp gathers near the side surface of the third electrode M3 and does not overlap the light-emitting layer in a plan view) is a fourth voltage Vth4 (≥0). Although the third voltage Vth3 and the fourth voltage Vth4 are never both 0, one of the third voltage Vth3 and the fourth voltage Vth4 may be 0.

As shown in FIG. 9(d), by setting the potential difference Vs when no current is injected into the second electrode M2 to be less than the third voltage Vth3 and setting the potential difference Vs (=Vmin−Vo) when the potential VA is Vmin to be greater than the third voltage Vth3, when no current is injected into the second electrode M2, the optical adjustment element TLp is in the light blocking state, and when the potential VA is Vmin or higher, the optical adjustment element TLp is in the transient state or the light transmitting state. As an example, Vo=1.0 [V], Vth3=0.0 [V], Vmin=2.0 [V], and Vmax=5.0 [V] are assumed. Usually, the light-emitting layer EM has a relative dielectric constant ce of about 8.0 and a film thickness De of about 50 nm, and the optical adjustment element TLp has a relative dielectric constant εj of about 7.0 and a film thickness Dj of about 25 μm. Equation 5 holds for the electrophoretic layer capacitance Cj.

$$Cj = \varepsilon 0 \times \varepsilon j \times S/Dj \quad \text{[Equation 5]}$$

From Equations 2, 4, and 5, when no current is injected into the second electrode M2, Vaj is 0.998 V and Vsj is −0.002 V, which is negative value smaller than Vth3. When Vmin is applied to the second electrode M2, Vs is 1.0 V, which is a positive value larger than Vth3.

In other words, during a non-light emission period in which the light-emitting layer EM is in a non-light emission state, the optical adjustment element TLp is in the light blocking state and the subpixel is displayed in black gray scale, and during a light emission period in which the light-emitting layer EM is in a light emission state, the optical adjustment element TLp is in the light transmitting state or the transient state and the subpixel is displayed in gray levels to white gray scale.

According to the second embodiment, when the light-emitting layer EM is in the light emission state (light emission period), the optical adjustment element TLp is autonomously in the light transmitting state or the transient state. At this time, light from the light-emitting layer EM is backscattered by the light scattering layer ZL, and light usage efficiency (light extraction efficiency) is enhanced. When the light-emitting layer EM is in the non-light emission state (non-light emission period), the optical adjustment element TLp is autonomously in the light blocking state to block external light incident from a viewing surface. Accordingly, scattering of external light (e.g., glare) in the light scattering layer ZL is suppressed, and screen quality can be enhanced.

Third Embodiment

Figure 10:
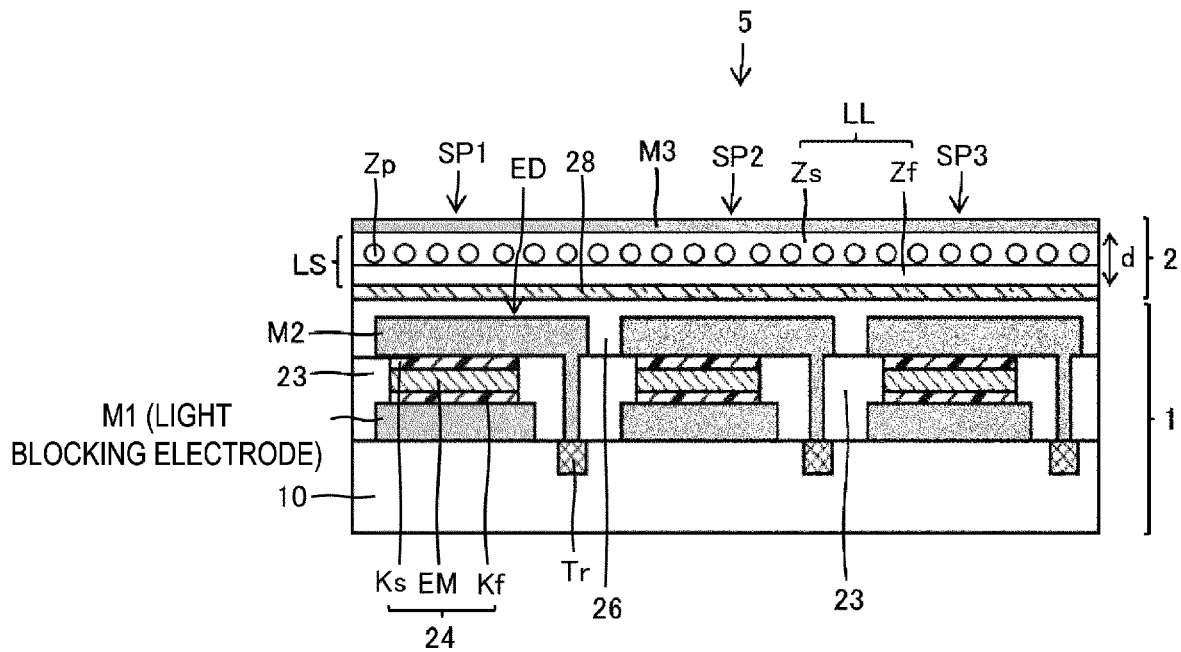
FIGS. 10(a) and 10(b) are cross-sectional views illustrating configurations of display devices according to a third embodiment.
Figure 10:
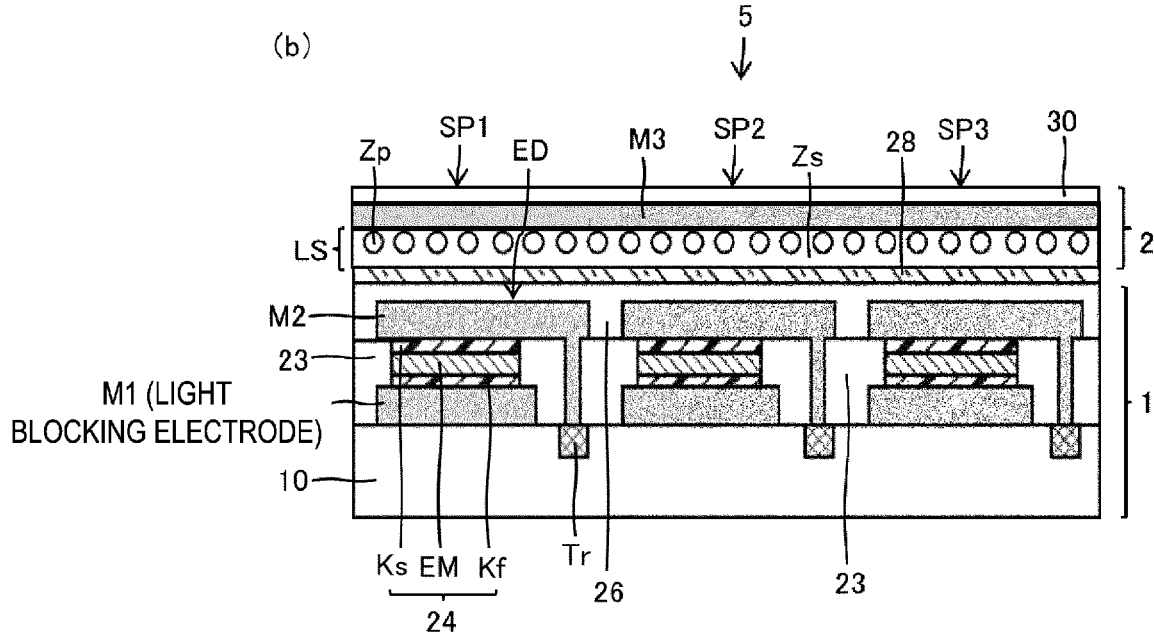

FIGS. 10(a) and 10(b) are cross-sectional views illustrating configurations of display devices according to a third embodiment. As illustrated in FIG. 10, a display device 5 includes a first member 1 and a second member 2 facing the first member 1. In the first member 1, first electrodes M1, an edge cover film 23, electroluminescent (EL) layers 24, second electrodes M2, and a sealing layer 26 are provided in this order on a TFT substrate 10 including multiple thin film transistors Tr. In the second member 2, an optical adjustment element LS containing light scattering bodies Zp having a size of several tens of nm to several tens of μm, and a third electrode M3 are provided in this order.

The display device 5 is of a top emission type, and is viewed from a second member 2 side. The second electrode M2, the sealing layer 26, and the third electrode M3 have a light transmitting property. The first electrode M1 is a light blocking electrode (e.g., light-reflecting electrode), but is not limited thereto. For example, the first electrode M1 may have a light transmitting property, and the TFT substrate 10 may have a light blocking property.

The optical adjustment element LS illustrated in FIG. 10(a) includes a base layer Zf, the light scattering bodies Zp, which are convex spherical bodies formed on the base layer Zf, and a cladding layer Zs that fills the unevenness caused by the light scattering bodies Zp. The optical adjustment element LS includes a light-transmissive layer LL including the base layer Zf and the cladding layer Zs, and the light scattering bodies Zp distributed in the light-transmissive layer LL. A thickness of the light-transmissive layer LL is represented by d. The first member 1 and the second member 2 are bonded by an adhesive layer 28 so that the base layer Zf is located on the sealing layer 26 of the first member 1.

The light scattering body Zp is not limited to a sphere, but may be a rectangular parallelepiped, a pyramid, or a cone. The light scattering body Zp may have a random shape such as a polyhedron.

As the light scattering body Zp, a material having a quadratic electro-optical effect (Kerr effect), for example, a KTN crystal (refractive index of about 2.1) containing potassium, tantalum, niobium, and oxygen can be used. For the base layer Zf and the cladding layer Zs, a material (e.g., aluminum oxide) having a refractive index equivalent to that of the light scattering body Zp can be used. The light scattering bodies Zp are formed, for example, by dry etching a KTN film formed on the first cladding layer Zf into particles. As a material having a quadratic electro-optical effect (Kerr effect), in addition to KTN, lead zirconate titanate (PZT) and PLZT obtained by substituting some of lead in PZT with lanthanum (La) can be cited. A material of the light-transmissive layer LL is not limited to an inorganic substance, and may be an acrylic resin, a silicon resin, or the like.

As illustrated in FIG. 10(b), the display device 5 according to the third embodiment may have a configuration in which the second member 2 including the third electrode M3, the light scattering bodies Zp, and the cladding layer Zs formed in this order on a counter substrate 30 is bonded to the first member 1 with the adhesive layer 28.

The display device 5 includes a first subpixel SP1 that emits red light, a second subpixel SP2 that emits green light, and a third subpixel SP3 that emits blue light. Each of the first subpixel SP1, the second subpixel SP2, and the third subpixel SP3 includes the first electrode M1, the second electrode M2, the light-emitting layer EM, and the optical adjustment element LS. The third electrode M3 is common to the first subpixel SP1, the second subpixel SP2, and the third subpixel SP3. The light-emitting layer EM of the first subpixel SP1 emits red light, the light-emitting layer EM of the second subpixel SP2 emits green light, and the light-emitting layer EM of the third subpixel SP3 emits blue light.

The first electrode M1 and the second electrode M2 are connected to the pixel circuit PC (FIG. 4) of the TFT substrate 10 and overlap each other in a plan view. The second electrode M2 is connected to the transistor Tr of the TFT substrate 10. The light-emitting layer EM is placed between the first electrode M1 and the second electrode M2, and overlaps the first electrode M1 and the second electrode M2 in a plan view. The third electrode M3 faces the second electrode M2 via the optical adjustment element LS, and can form an electrical field between the second electrode M2 and the third electrode M3.

The optical adjustment element LS overlaps the light-emitting layer EM in a plan view, and a refractive index of the light scattering bodies Zp changes according to a potential difference between the second electrode M2 and the third electrode M3 (=a potential of the second electrode—a potential of the third electrode).

FIG. 11(a) is an explanatory diagram illustrating potentials of the first to third electrodes, FIG. 11(b) is a graph showing a characteristic of current of the light-emitting layer and light emission intensity, FIG. 11(c) is a graph showing a characteristic of the current of the light-emitting layer and voltage, FIG. 11(d) is a graph showing a characteristic of the voltage of the light-emitting layer and the light emission intensity, and FIG. 11(e) is a graph showing a characteristic of voltage of the optical adjustment element and refractive index change.

Figure 11:
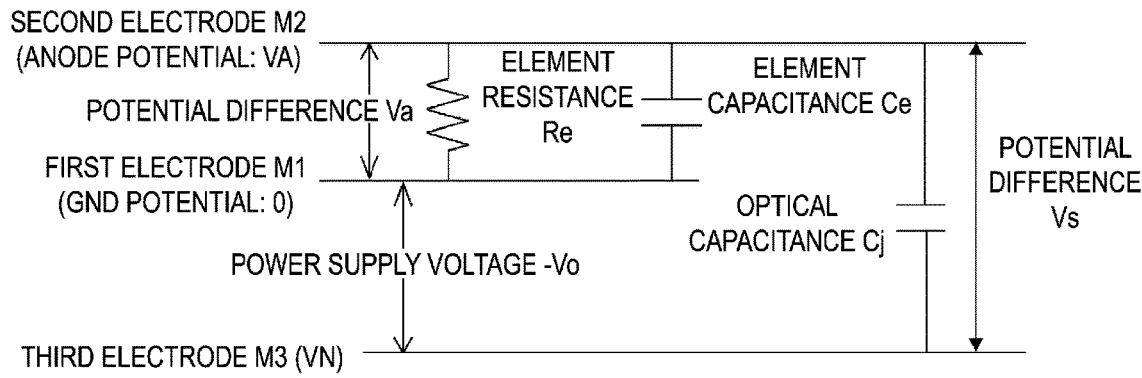
FIG. 11(a) is an explanatory diagram illustrating potentials of first to third electrodes.
FIG. 11(b) is a graph showing a characteristic of current of a light-emitting layer and light emission intensity.
FIG. 11(c) is a graph showing a characteristic of the current of the light-emitting layer and voltage.
FIG. 11(d) is a graph showing a characteristic of the voltage of the light-emitting layer and the light emission intensity.
FIG. 11(e) is a graph showing a characteristic of voltage of an optical adjustment element and refractive index.
Figure 11:
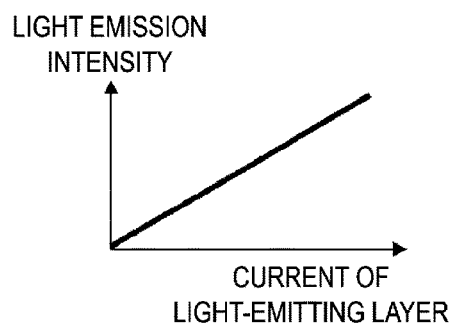
Figure 11:
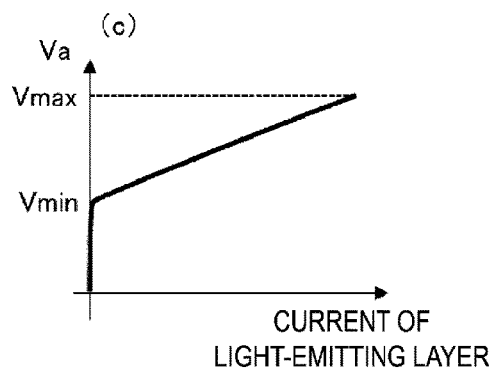
Figure 11:
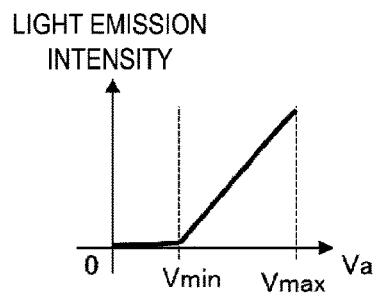
Figure 11:
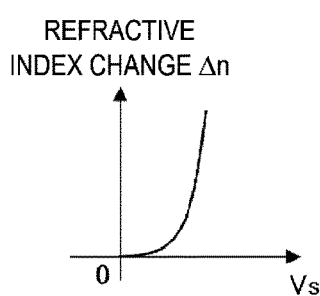

In the third embodiment, as illustrated in FIG. 11, the potential of the first electrode M1 connected to the ground is 0, a potential VA of the second electrode M2 is an anode potential, and a potential VN of the third electrode M3 is a counter potential.

An element resistance Re and an element capacitance Ce are formed between the first electrode M1 and the second electrode M2. An optical capacitance Cj is formed by the second electrode M2, the third electrode M3, and the optical adjustment element LS.

In the light-emitting element ED, when current generated in the light-emitting layer EM (current at the element resistance Re) increases, the light emission intensity of the light-emitting layer EM increases, and the potential difference Va between the second electrode M2 and the first electrode M1 also increases. Due to the element capacitance Ce, no current is generated in the light-emitting layer EM when the potential difference Va is less than Vmin (positive voltage) in FIG. 11, and current is generated in the light-emitting layer EM (the light-emitting layer EM emits light) when the potential difference Va is Vmin or higher in FIG. 11. When the potential difference Va is Vmax, the light emission intensity of the light-emitting layer EM is maximum (luminance corresponding to the maximum gray scale of the subpixel). A potential difference Vs (=VA−VN) between the second electrode M2 and the third electrode M3 is a voltage applied to the optical capacitance Cj (including the optical adjustment element LS). Since the potential of the first electrode M1 is 0, the potential VN is a value of the power supply voltage −Vo itself, and the potential VA is a value of the potential difference Va itself. When no current is injected (no voltage is applied) to the second electrode M2, the potential difference Va is a divided voltage determined by Equation 5 below based on a capacitance ratio between the element capacitance Ce and the optical capacitance Cj.

[Equation 5]

$$Vak = -Vo \times Ce/(Ce+Cj) \qquad 5$$

As shown in FIG. 11(e), a refractive index change Δn of the light scattering bodies Zp increases quadratically with an increase in the potential difference Vs (quadratic electro-optical effect).

FIG. 12(a) is a schematic view illustrating a layered structure of the light-emitting layer and the first to third electrodes according to the third embodiment, FIG. 12(b) is a schematic view illustrating states of the optical adjustment element and the light-emitting layer, FIG. 12(c) is an explanatory diagram illustrating operation of the display device, and FIG. 12(d) is a graph showing a characteristic of voltage of the light scattering bodies and the refractive index change.

Figure 12:
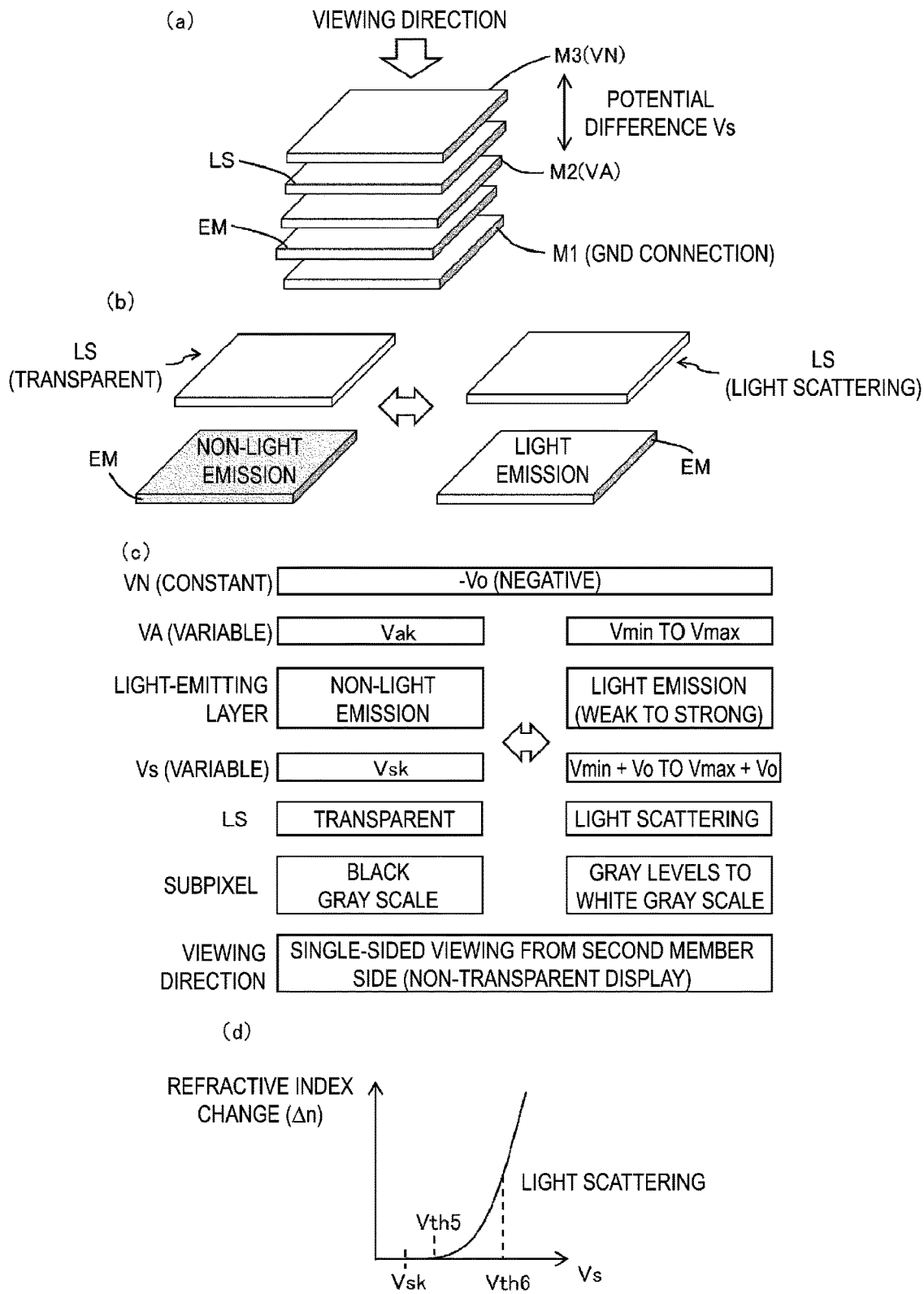
FIG. 12(a) is a schematic view illustrating a layered structure of the light-emitting layer and the first to third electrodes of the third embodiment.
FIG. 12(b) is a schematic view illustrating states of the optical adjustment element and the light-emitting layer.
FIG. 12(c) is an explanatory diagram illustrating operation of the display device.
FIG. 12(d) is a graph showing a characteristic of voltage of light scattering bodies and refractive index change.

As illustrated in FIG. 12, the optical adjustment element LS is in one of multiple optical states (transparent state and light scattering state) according to the potential difference Vs. To be specific, the optical adjustment element LS is in the transparent state when the potential VA of the second electrode M2 is low (the potential difference Vs is small), and is in the light scattering state when the potential VA of the second electrode M2 is high (the potential difference Vs is large).

Here, as shown in FIG. 12(d), by making a value Vsk (=Vo×Cj/(Ce+Cj)) of the potential difference Vs when no current is injected into the second electrode M2 smaller than a potential difference (threshold value Vth5) at which a refractive index change curve (quadratic function) rises and making the potential difference Vs (=Vmin+Vo) when Va is Vmin larger than a potential difference (threshold value Vth6) corresponding to a refractive index change in the light scattering state, the optical adjustment element LS is in the transparent state when the potential VA is 0 and is in the light scattering state when the potential Va is Vmin or higher. As an example, Vo is assumed to be −5.1 [V], Vmin is assumed to be 2.0 [V], and Vmax is assumed to be 5.0 [V]. The optical capacitance Cj is calculated using Equation 6 below.

[Equation 6]

$$Cj = \varepsilon 0 \times \varepsilon k \times S/d \qquad 6$$

where εk is a dielectric constant of the light scattering layer and d is a thickness of the optical adjustment element LS.

Figure 13:
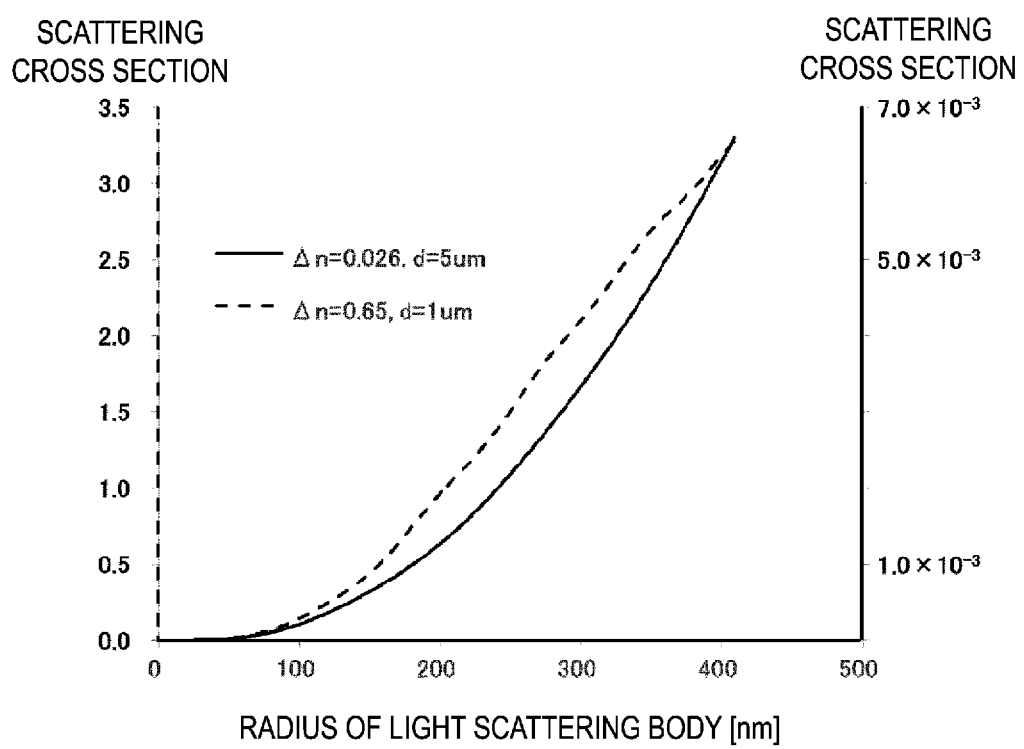
FIG. 13 is a graph showing a relationship between a radius of the light scattering bodies and a scattering cross section.

FIG. 13 is a graph showing a relationship between a radius of a light scattering body (particle radius), which is a particle, and a scattering cross section. A vertical axis represents the scattering cross section (QSC) when Vs is 5.1 [V] and a wavelength is 530 nm. A dashed line shows a case in which the thickness d of the optical adjustment element LS is 1 μm, and a solid line shows a case in which the thickness d of the optical adjustment element LS is 5 μm. A left vertical axis is for d of 1 μm, and a right vertical axis is for d of 5 μm.

When d is 1 μm, the refractive index change of the light scattering body Zp is 0.65, and when d is 5 μm, the refractive index change of the light scattering body Zp is 0.026. This graph shows that scattering intensity is higher when d is 1 μm. It is possible to make the thickness d even thinner, but a smaller thickness d requires a smaller particle radius. In consideration of this, the thickness d of the optical adjustment layer LS is preferably 1 μm or less, and the particle radius is preferably 200 nm or more.

Usually, the light-emitting layer EM has a relative dielectric constant εe of about 8.0 and a film thickness De of about 50 nm, and the optical adjustment element LS has the relative dielectric constant εk of about 4.4 and the film thickness d of about 1 μm. From Equations 2, 5, and 6, when no current is injected into the second electrode M2, Vak is −4.96 V and Vsk is −0.14 V, and the refractive index change at this time is $3.4 \times 10^{-7}$. When current is injected into the second electrode M2 and Va is Vmin, Vs is 3.1 V, and the refractive index change at this time is 0.65 as described above.

In this way, during a non-light emission period in which the light-emitting layer EM is in a non-light emission state, the optical adjustment element LS is in the transparent state and the subpixel is displayed in black gray scale, and during a light emission period in which the light-emitting layer EM is in a light emission state, the optical adjustment element LS is in the light scattering state and the subpixel is displayed in gray levels to white gray scale.

According to the third embodiment, when the light-emitting layer EM is in the light emission state (light emission period), the optical adjustment element LS is autonomously in the light scattering state. At this time, light from the light-emitting layer EM is forward scattered by the optical adjustment element LS, and light usage efficiency (light extraction efficiency) is enhanced. When the light-emitting layer EM is in the non-light emission state (non-light emission period), the optical adjustment element LS is autonomously in the transparent state. Thus, external light scattering (e.g., glare) does not occur in the optical adjustment element LS, and screen quality is ensured.

Since the shorter the wavelength, the greater the scattering intensity, it is preferable to increase the density of the light scattering bodies Zp in the optical adjustment layer LS for the red light emitting subpixel (first subpixel SP1) and the green light emitting subpixel (second subpixel SP2) relative to the blue light emitting subpixel (third subpixel SP3).

Fourth Embodiment

Figure 14:
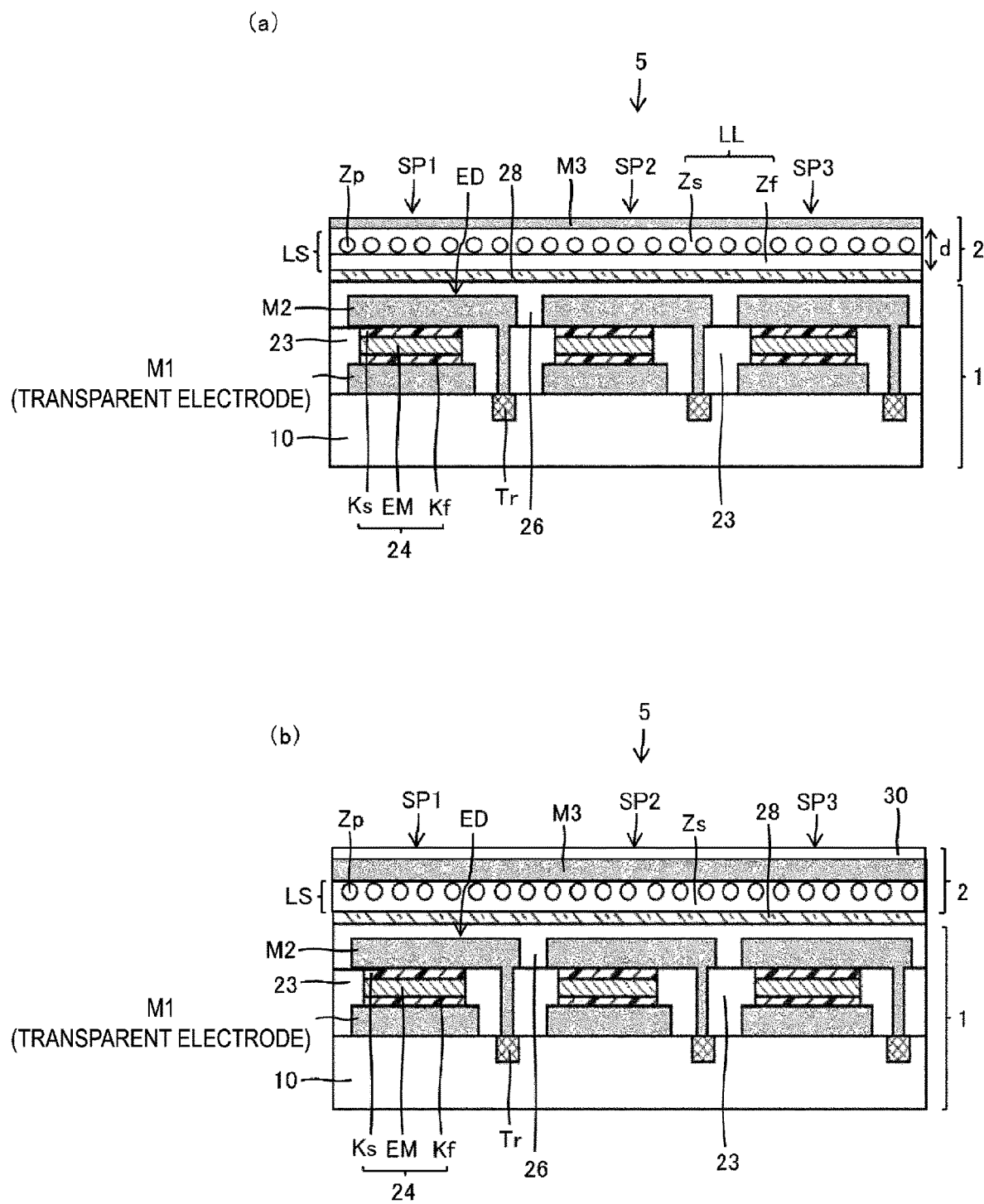
FIGS. 14(a) and 14(b) are cross-sectional views illustrating configurations of display devices according to a fourth embodiment.

FIGS. 14(a) and 14(b) are cross-sectional views illustrating configurations of display devices according to a fourth embodiment. As illustrated in FIG. 14, a display device 5 includes a first member 1 and a second member 2 facing the first member 1. In the first member 1, first electrodes M1, an edge cover film 23, electroluminescent (EL) layers 24, second electrodes M2, and a sealing layer 26 are provided in this order on a TFT substrate 10 including multiple thin film transistors Tr. In the second member 2, a first cladding layer Zf, light scattering bodies Zp, a second cladding layer Zs, and a third electrode M3 are provided in this order.

The display device 5 is a transparent display, and can be viewed from a TFT substrate 10 side (first substrate side) and from an opposite side (second substrate side) (double-sided viewing). The TFT substrate 10, the first electrode M1, the second electrode M2, the sealing layer 26, and the third electrode M3 have a light transmitting property. A configuration of the second member 2 is the same as that in the third embodiment.

FIG. 15(a) is a schematic view illustrating a layered structure of a light-emitting layer and the first to third electrodes according to the fourth embodiment, FIG. 15(b) is a schematic view illustrating states of an optical adjustment element and the light-emitting layer, and FIG. 15(c) is an explanatory diagram illustrating operation of the display device.

Figure 15:
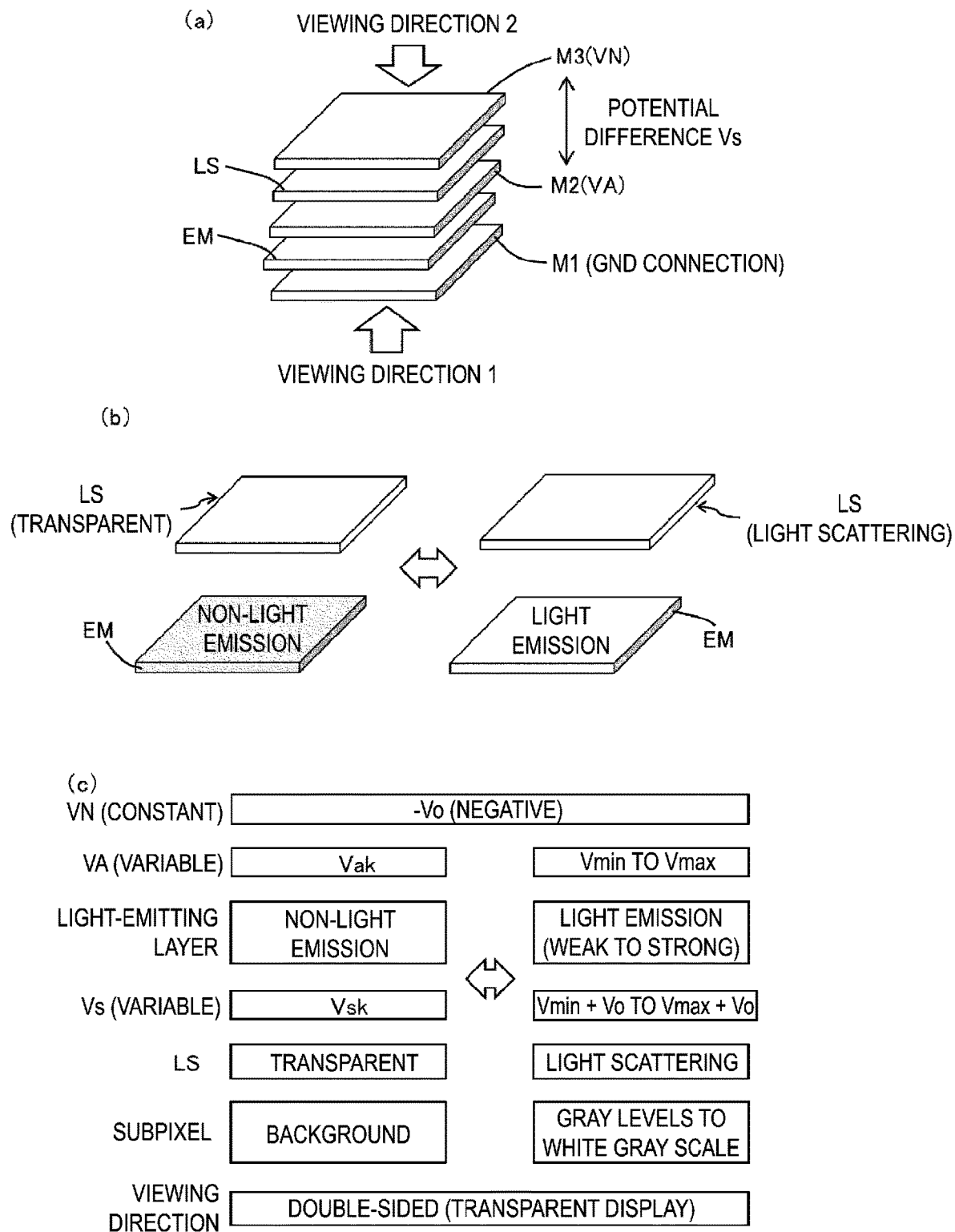
FIG. 15(a) is a schematic view illustrating a layered structure of a light-emitting layer and the first to third electrodes according to the fourth embodiment.
FIG. 15(b) is a schematic view illustrating states of an optical adjustment element and the light-emitting layer.
FIG. 15(c) is an explanatory diagram illustrating operation of the display device.

As illustrated in FIG. 15, the optical adjustment element LS is in a transparent state when a potential VA of the second electrode M2 is low (a potential difference Vs is small), and is in a light scattering state when the potential VA of the second electrode M2 is high (the potential difference Vs is large). In other words, when the light-emitting layer EM is in a non-light emission state, the optical adjustment element LS is in the transparent state and the subpixel is displayed in background, and when the light-emitting layer EM is in a light emission state, the optical adjustment element LS is in the light scattering state and the subpixel is displayed in gray levels to white gray scale.

For a viewing direction 1 (viewing from the first substrate side) of the fourth embodiment, during a light emission period in which the light-emitting layer EM is in the light emission state, the optical adjustment element LS is autonomously in the light scattering state. At this time, light from the light-emitting layer EM is backscattered by the optical adjustment element LS, and light usage efficiency (light extraction efficiency) is enhanced. During a non-light emission period in which the light-emitting layer EM is in the non-light emission state, the optical adjustment element LS is autonomously in the transparent state in which light is not scattered. Thus, external light scattering (e.g., glare) does not occur in the optical adjustment element LS, and screen quality is ensured.

For a viewing direction 2 (viewing from the second substrate side) of the fourth embodiment, during a light emission period in which the light-emitting layer EM is in the light emission state, the optical adjustment element LS is autonomously in the light scattering state. At this time, light from the light-emitting layer EM is forward scattered by the optical adjustment element LS, and light usage efficiency (light extraction efficiency) is enhanced. During a non-light emission period in which the light-emitting layer EM is in the non-light emission state, the optical adjustment element LS is autonomously in the transparent state in which light is not scattered. Thus, external light scattering (e.g., glare) does not occur in the optical adjustment element LS, and screen quality is ensured.

In each of the embodiments described above, the electroluminescence of the light-emitting layer EM between the first electrode M1 and the second electrode M2 is exemplified. However, as a modified example, a photoluminescent layer (PL layer) can be provided between the second electrode and the optical adjustment element in addition to the light-emitting layer EM. The PL layer contains, for example, quantum dots and has an optical wavelength conversion function by photoluminescence. The optical wavelength conversion function is a function of absorbing short wavelength light (e.g., blue light) and emitting long wavelength light (e.g., red light or green light). According to this configuration, the PL layer is excited by light emitted by the light-emitting layer EM, and light having a wavelength longer than the light emission wavelength of the light-emitting layer EM can be emitted. The PL layer is placed closer to a viewing surface than the first electrode M1, the second electrodes M2, and the light-emitting layer EM in the subpixel including the PL layer. This is to prevent a viewer from directly viewing light from the light-emitting layer EM in the subpixel. Although the PL layer contains quantum dots in the above description, the PL layer does not necessarily contain quantum dots. The PL layer can be made of any material as long as it has an optical wavelength conversion function. To be specific, a fluorescent substance, a phosphorescent substance, or the like can be used as the material of the PL layer. The light-emitting layer EM may be made of any material as long as electroluminescence is caused.

The embodiments described above are for the purpose of illustration and description and are not intended to be limiting. It will be apparent to those skilled in the art that many variations will be possible in accordance with these examples and descriptions.

Supplement

First Aspect

A display device includes a TFT substrate including a thin film transistor, a light-emitting element including a first electrode and a second electrode overlapping each other in a plan view, and a light-emitting layer placed between the first electrode and the second electrode, a third electrode capable of forming an electrical field between the second electrode and the third electrode, an optical adjustment element overlapping the light-emitting layer in a plan view and having an optical characteristic that changes in accordance with a potential difference between the second electrode and the third electrode, and light scattering bodies included in at least one of the TFT substrate, the light-emitting element, and the optical adjustment element.

Second Aspect

In the display device according to, for example, the first aspect, the optical adjustment element is in one of multiple optical states in accordance with the potential difference.

Third Aspect

In the display device according to, for example, the second aspect, when the potential difference exceeds a first voltage, the optical adjustment element switches from a light blocking state to a transient state, and when the potential difference exceeds a second voltage, the optical adjustment element switches from the transient state to a light transmitting state.

Fourth Aspect

In the display device according to, for example, the third aspect, during a non-light emission period of the light-emitting layer, the optical adjustment element is in the light blocking state, and during a light emission period of the light-emitting layer, the optical adjustment element is in the transient state or the light transmitting state.

Fifth Aspect

In the display device according to, for example, the fourth aspect, a potential of the first electrode and a potential of the third electrode are fixed.

Sixth Aspect

In the display device according to, for example, the fifth aspect, a potential of the second electrode during the light emission period is higher than a potential of the second electrode during the non-light emission period.

Seventh Aspect

In the display device according to, for example, the fifth or the sixth aspect, the potential of the first electrode is equal to or greater than the potential of the third electrode.

Eighth Aspect

In the display device according to, for example, any one of the first to the seventh aspect, the TFT substrate includes a light scattering layer containing the light scattering bodies.

Ninth Aspect

In the display device according to, for example, any one of the first to the seventh aspect, the light-emitting element includes a charge transport layer containing the light scattering bodies.

Tenth Aspect

In the display device according to, for example, the third aspect, the optical adjustment element includes a liquid crystal layer, and a first polarizer and a second polarizer having polarization axes parallel to each other, and the liquid crystal layer is placed between the first polarizer and the second polarizer.

Eleventh Aspect

The display device according to, for example, the 10th aspect, when the optical adjustment element is in the light blocking state, a polarization direction of light incident on the liquid crystal layer is rotated by 90 degrees, and when the optical adjustment element is in the light transmitting state, a polarization direction of light incident on the liquid crystal layer is maintained.

Twelfth Aspect

In the display device according to, for example, the 10th aspect, the TFT substrate is provided below the first electrode and the second electrode, the third electrode is provided above the first electrode and the second electrode, and the liquid crystal layer is placed between the second electrode and the third electrode.

Thirteenth Aspect

In the display device according to, for example, the 12th aspect, between the second electrode and the third electrode, the first polarizer and the second polarizer are disposed.

Fourteenth Aspect

In the display device according to, for example, the 12th aspect, between the second electrode and the third electrode, the first polarizer is placed, and the second polarizer is placed above the third electrode.

Fifteenth Aspect

In the display device according to, for example, any one of the 1st to the 14th aspects, the first electrode has light reflectivity, and the second electrode and the third electrode have a light transmitting property.

Sixteenth Aspect

In the display device according to, for example, the 10th aspect, the second electrode and the third electrode are provided adjacent to each other in a planar direction, and the liquid crystal layer adopts a transverse electrical field control mode.

Seventeenth Aspect

In the display device according to, for example, the second aspect, the optical adjustment element is an electrophoretic layer containing toner movable by an electrical field between the second electrode and the third electrode.

Eighteenth Aspect

In the display device according to, for example, the 17th aspect, when the optical adjustment element is in a light blocking state, the toner overlaps the light-emitting layer in a plan view, and when the optical adjustment element is in a light transmitting state, the toner does not overlap the light-emitting layer in a plan view.

Nineteenth Aspect

In the display device according to, for example, the first or the second aspect, the light scattering bodies are contained in the optical adjustment element.

Twentieth Aspect

In the display device according to, for example, the 19th aspect, the light scattering bodies have a light refractive index that changes in accordance with the potential difference.

Twenty-First Aspect

In the display device according to, for example, the 20th aspect, an optical refractive index change of the light scattering bodies is larger during a light emission period than during a non-light emission period of the light-emitting layer.

Twenty-Second Aspect

In the display device according to, for example, any one of the 19th to the 21st aspects, during a non-light emission period of the light-emitting layer, the optical adjustment element is in a transparent state, and during a light emission period of the light-emitting layer, the optical adjustment element is in a light scattering state.

Twenty-Third Aspect

In the display device according to, for example, the 22nd aspect, the light scattering bodies are made of a material having a quadratic electro-optical effect.

Twenty-Fourth Aspect

In the display device according to, for example, the 23rd aspect, the light scattering state appears due to a quadratic electro-optical effect of the light scattering bodies.

Twenty-Fifth Aspect

In the display device according to, for example, any one of the 19th to the 24th aspects, the optical adjustment element includes a light-transmissive layer and the light scattering bodies being particles and distributed in the light-transmissive layer, and the light-transmissive layer has a thickness of 1.0 µm or less, and the light scattering bodies have a radius of 200 nm or more.

Twenty-Sixth Aspect

The display device according to, for example, any one of the 19th to the 24th aspects includes a first subpixel, a second subpixel, and a third subpixel, in which each of the first subpixel, the second subpixel, and the third subpixel includes the light-emitting element and the optical adjustment element, light emitted by a light-emitting layer of the first subpixel has a longer wavelength than light emitted by a light-emitting layer of the third subpixel, and a density of light scattering bodies in the optical adjustment element of the first subpixel is higher than a density of light scattering bodies in the optical adjustment element of the third subpixel.

Twenty-Seventh Aspect

In the display device according to, for example, the 26th aspect, light emitted by a light-emitting layer of the second subpixel has a longer wavelength than the light emitted by the light-emitting layer of the third subpixel, and a density of light scattering bodies in the optical adjustment element of the second subpixel is higher than the density of the light scattering bodies in the optical adjustment element of the third subpixel.

Twenty-Eighth Aspect

In the display device according to, for example any one of the 22nd to the 27th aspects, the light-emitting element and the optical adjustment element are provided in this order on the TFT substrate, at least one of the first electrode and the TFT substrate has a light blocking property, and the display device is viewed from a side opposite to the TFT substrate.

Twenty-Ninth Aspect

In the display device according to, for example, any one of the 22nd to the 27th aspects, the light-emitting element and the optical adjustment element are provided in this order on the TFT substrate, the first electrode and the TFT substrate have a light transmitting property, and the display device is able to be viewed from a side of the TFT substrate and from a side opposite to the TFT substrate.

The invention claimed is:
1. A display device comprising:
a TFT substrate including a thin film transistor;
a light-emitting element including a first electrode and a second electrode overlapping each other in a plan view, and a light-emitting layer placed between the first electrode and the second electrode;
a third electrode capable of forming an electrical field between the second electrode and the third electrode;
an optical adjustment element overlapping the light-emitting layer in a plan view and having an optical characteristic that changes in accordance with a potential difference between the second electrode and the third electrode; and
light scattering bodies included in at least one of the TFT substrate, the light-emitting element, and the optical adjustment element,
wherein the optical adjustment element is in one of multiple optical states in accordance with the potential difference,
when the potential difference exceeds a first voltage, the optical adjustment element switches from a light blocking state to a transient state,
when the potential difference exceeds a second voltage, the optical adjustment element switches from the transient state to a light transmitting state,
during a non-light emission period of the light-emitting layer, the optical adjustment element is in the light blocking state,
during a light emission period of the light-emitting layer, the optical adjustment element is in the transient state or the light transmitting state,
a potential of the first electrode and a potential of the third electrode are fixed, and
a potential of the second electrode during the light emission period is higher than a potential of the second electrode during the non-light emission period.
2. The display device according to claim 1,
wherein the TFT substrate includes a light scattering layer containing the light scattering bodies.
3. The display device according to claim 1,
wherein the light-emitting element includes a charge transport layer containing the light scattering bodies.
4. The display device according to claim 1,
wherein the optical adjustment element is an electrophoretic layer containing toner movable by an electrical field between the second electrode and the third electrode.
5. The display device according to claim 4,
wherein when the optical adjustment element is in a light blocking state, the toner overlaps the light-emitting layer in a plan view, and
when the optical adjustment element is in a light transmitting state, the toner does not overlap the light-emitting layer in a plan view.
6. A display device comprising:
a TFT substrate including a thin film transistor;
a light-emitting element including a first electrode and a second electrode overlapping each other in a plan view, and a light-emitting layer placed between the first electrode and the second electrode;
a third electrode capable of forming an electrical field between the second electrode and the third electrode;
an optical adjustment element overlapping the light-emitting layer in a plan view and having an optical characteristic that changes in accordance with a potential difference between the second electrode and the third electrode; and
light scattering bodies included in at least one of the TFT substrate, the light-emitting element, and the optical adjustment element,
wherein the optical adjustment element is in one of multiple optical states in accordance with the potential difference,
when the potential difference exceeds a first voltage, the optical adjustment element switches from a light blocking state to a transient state,
when the potential difference exceeds a second voltage, the optical adjustment element switches from the transient state to a light transmitting state,
the optical adjustment element includes a liquid crystal layer, and a first polarizer and a second polarizer having polarization axes parallel to each other, and
the liquid crystal layer is placed between the first polarizer and the second polarizer.
7. The display device according to claim 6,
wherein when the optical adjustment element is in the light blocking state, a polarization direction of light incident on the liquid crystal layer is rotated by 90 degrees, and
when the optical adjustment element is in the light transmitting state, a polarization direction of light incident on the liquid crystal layer is maintained.
8. The display device according to claim 6,
wherein the TFT substrate is provided below the first electrode and the second electrode,
the third electrode is provided above the first electrode and the second electrode, and
the liquid crystal layer is placed between the second electrode and the third electrode.
9. The display device according to claim 8,
wherein between the second electrode and the third electrode, the first polarizer and the second polarizer are disposed.
10. The display device according to claim 8,
wherein between the second electrode and the third electrode, the first polarizer is placed, and
the second polarizer is placed above the third electrode.
11. The display device according to claim 6,
wherein the second electrode and the third electrode are provided adjacent to each other in a planar direction, and
the liquid crystal layer adopts a transverse electrical field control mode.
12. A display device comprising:
a TFT substrate including a thin film transistor;
a light-emitting element including a first electrode and a second electrode overlapping each other in a plan view, and a light-emitting layer placed between the first electrode and the second electrode;
a third electrode capable of forming an electrical field between the second electrode and the third electrode;
an optical adjustment element overlapping the light-emitting layer in a plan view and having an optical characteristic that changes in accordance with a potential difference between the second electrode and the third electrode; and
light scattering bodies included in at least one of the TFT substrate, the light-emitting element, and the optical adjustment element,
wherein the light scattering bodies are contained in the optical adjustment element, during a non-light emission period of the light-emitting layer, the optical adjustment element is in a transparent state, and during a light emission period of the light-emitting layer, the optical adjustment element is in a light scattering state.

13. The display device according to claim 12, wherein the light scattering bodies are made of a material having a quadratic electro-optical effect.

14. The display device according to claim 13, wherein the light scattering state appears due to a quadratic electro-optical effect of the light scattering bodies.

15. The display device according to claim 12, wherein the optical adjustment element includes a light-transmissive layer and the light scattering bodies being particles and distributed in the light-transmissive layer, and the light-transmissive layer has a thickness of 1.0 μm or less, and the light scattering bodies have a radius of 200 nm or more.

16. The display device according to claim 12, comprising:
a first subpixel, a second subpixel, and a third subpixel, wherein each of the first subpixel, the second subpixel, and the third subpixel includes the light-emitting element and the optical adjustment element,
light emitted by a light-emitting layer of the first subpixel has a longer wavelength than light emitted by a light-emitting layer of the third subpixel, and
a density of light scattering bodies in the optical adjustment element of the first subpixel is higher than a density of light scattering bodies in the optical adjustment element of the third subpixel.

17. The display device according to claim 16, wherein light emitted by a light-emitting layer of the second subpixel has a longer wavelength than the light emitted by the light-emitting layer of the third subpixel, and a density of light scattering bodies in the optical adjustment element of the second subpixel is higher than the density of the light scattering bodies in the optical adjustment element of the third subpixel.

18. The display device according to claim 12, wherein the light-emitting element and the optical adjustment element are provided in this order on the TFT substrate,
at least one of the first electrode and the TFT substrate has a light blocking property, and
the display device is viewed from a side opposite to the TFT substrate.

19. The display device according to claim 12, wherein the light-emitting element and the optical adjustment element are provided in this order on the TFT substrate,
the first electrode and the TFT substrate have a light transmitting property, and
the display device is able to be viewed from a side of the TFT substrate and from a side opposite to the TFT substrate.

20. The display device according to claim 12, wherein the light scattering bodies have a light refractive index that changes in accordance with the potential difference, and
an optical refractive index change of the light scattering bodies is larger during a light emission period than during a non-light emission period of the light-emitting layer.

* * * * *